(12) United States Patent
Yoshibayashi et al.

(10) Patent No.: US 9,352,520 B2
(45) Date of Patent: May 31, 2016

(54) PATTERN FORMING METHOD, METHOD FOR MANUFACTURING COLOR FILTER, AND COLOR FILTER MANUFACTURED THEREBY

(71) Applicant: FUJIFILM Corporation, Tokyo (JP)

(72) Inventors: Mitsuji Yoshibayashi, Shizuoka (JP); Yasuo Sugishima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 169 days.

(21) Appl. No.: 14/227,342

(22) Filed: Mar. 27, 2014

(65) Prior Publication Data

US 2014/0211334 A1   Jul. 31, 2014

Related U.S. Application Data

(63) Continuation of application No. PCT/JP2012/075873, filed on Sep. 28, 2012.

(30) Foreign Application Priority Data

Sep. 29, 2011   (JP) ................................. 2011-215626

(51) Int. Cl.
*B44C 1/22* (2006.01)
*B29D 11/00* (2006.01)
*G03F 7/00* (2006.01)
*G02B 5/20* (2006.01)
*G02B 5/23* (2006.01)
*G02F 1/1335* (2006.01)

(52) U.S. Cl.
CPC .......... *B29D 11/00634* (2013.01); *G02B 5/201* (2013.01); *G02B 5/23* (2013.01); *G02F 1/133516* (2013.01); *G03F 7/0007* (2013.01)

(58) Field of Classification Search
CPC ........ G03F 7/0007; G02B 5/201; G02B 5/23; B29D 11/00634
USPC .............................. 216/49, 50, 58, 72; 438/70
See application file for complete search history.

(56) References Cited

U.S. PATENT DOCUMENTS

| 2002/0074936 A1 | 6/2002 | Yamazaki et al. |
| 2004/0214445 A1* | 10/2004 | Shimizu ............ H01L 21/32139 438/706 |
| 2008/0017607 A1* | 1/2008 | Yoshibayashi ........ G03F 7/0007 216/24 |
| 2008/0053953 A1* | 3/2008 | Yoshibayashi ......... G02B 5/223 216/24 |
| 2008/0096332 A1* | 4/2008 | Lee ..................... H01L 27/1214 438/151 |

(Continued)

FOREIGN PATENT DOCUMENTS

| JP | 2003-332310 A | 11/2003 |
| JP | 2007-500919 A | 1/2007 |

(Continued)

OTHER PUBLICATIONS

Office Action issued Sep. 24, 2014, by the Japanese Patent Office in related Application No. 2011-215626.

(Continued)

*Primary Examiner* — Binh X Tran
(74) *Attorney, Agent, or Firm* — Sughrue Mion, PLLC

(57) ABSTRACT

There is provided a pattern forming method, including: forming an organic film layer on a substrate; forming a patterned photoresist mask on the organic film layer; and performing a specific dry etching process to form a pattern on the organic layer.

9 Claims, 4 Drawing Sheets

(56) References Cited

U.S. PATENT DOCUMENTS

| | | | |
|---|---|---|---|
| 2008/0233492 A1* | 9/2008 | Suzuki | G02B 5/201 430/7 |
| 2009/0104545 A1* | 4/2009 | Chen | G02B 5/201 430/7 |
| 2010/0155732 A1* | 6/2010 | Suzawa | H01L 21/31116 257/59 |

FOREIGN PATENT DOCUMENTS

| | | | |
|---|---|---|---|
| JP | 2008-216970 A | 9/2008 | |
| JP | 2011-32366 A | 2/2011 | |
| JP | 2011-66019 A | 3/2011 | |
| WO | 2005/057681 A1 | 6/2005 | |

OTHER PUBLICATIONS

International Search Report, dated Jan. 15, 2013, issued by the International Searching Authority in counterpart International Application No. PCT/JP2012/075873.

Written Opinion, dated Jan. 15, 2013, issued by the International Searching Authority in counterpart International Application No. PCT/JP2012/075873.

Office Action dated May 20, 2015 issued by the Korean Intellectual Property Office in counterpart Korean Patent Application No. 10-2014-7008405.

* cited by examiner

PATTERN FORMING METHOD, METHOD FOR MANUFACTURING COLOR FILTER, AND COLOR FILTER MANUFACTURED THEREBY

CROSS-REFERENCE TO RELATED APPLICATION(S)

This is a continuation of International Application No. PCT/JP2012/075873 filed on Sep. 28, 2012, claims priority from Japanese Patent Application No. 2011-215626 filed on Sep. 29, 2011, the entire disclosures of which are incorporated herein by reference.

TECHNICAL FIELD

The present invention relates to a pattern forming method, a method for manufacturing a color filter including forming a pattern by dry etching, and a color filter manufactured using the method.

For example, a solid-state imaging device is provided with a color filter, in which colored pixels of a plurality of colors such as red pixels, green pixels and blue pixels are two-dimensionally arranged on a support such as a semiconductor substrate. Recently, in the solid-state imaging device, as the pixel size is decreased, performance requirements for color separation have been rigorous, and in order to maintain device characteristics such as color shading characteristics and prevention of color mixing, the performance of a color filter requires thinning, rectangularity and removal of an overlapped region in which colors are overlapped between each colored pixel and the like.

However, as the pixels of a solid-state imaging device are miniaturized, it has become difficult to achieve both spectral characteristics and pattern formability of a color filter for the demand for miniaturization and thinning of the color filter in the pattern formation by a conventional photolithography. Specifically, in a color filter for a solid-state imaging device, the thickness thereof tends to become, for example, 1 μm or less for the thinning of a colored pattern and to become 2 μm or less (for example, 0.5 μm to 2.0 μm) for the pixel pattern size, thereby achieving a microsize.

Specifically, as the film thickness is becoming thinner, the relative amount of organic agents such as pigments in a film increases, while the amount of components other than the organic agents, which contribute to the photolithographic properties, in a film relatively decreases, and the pattern formability has a problem due to the decrease in that rectangularity is insufficient because pattern edges are round, for the requirement of forming a pattern below 2.0 μm. It is known that in a color filter (a color filter manufactured by the photolithography using a coloring radiation sensitive composition in which a pigment is dispersed in various compositions) using a pigment dispersion liquid, the rounding of the pattern edge becomes significant by the influence of lack of discretion of cure and dissolution by polymerization when exposuring.

In particular, recently, due to the demand for the higher definition of the color filter for a solid-state imaging device, the formability of a pattern of, for example, 1.0 μm becomes problematic, and thus, it is difficult to avoid the tradeoff between the thin film and the resolution of the color filter in the photolithography in the related art.

BACKGROUND ART

In this regard, it is suggested that an organic pattern is processed by dry etching (see Japanese Patent Application Laid-Open No. 2003-332310 (hereinafter JP-A-2003-332310) and Japanese Patent Application Laid-Open No. 2008-216970 (hereinafter JP-A-2008-216970)).

JP-A-2003-332310 suggests a technique in which an organic film layer is processed by dry etching to form a pattern which is capable of having high pixel density, and the surface deformed layer of a photoresist due to etching is removed by ashing to easily strip the photoresist. At this time, removal of the sparingly soluble layer of the photoresist is performed by controlling the flow rates of oxygen and halogenated gas. However, since the ratio of the halogen gas is high in the total gas flow rate, a problem of substrate damage (shaving) generally occurs due to overetching. For example, when an organic film layer on a substrate is removed by dry etching to form a pattern, even a part of the substrate may be shaved in the region where the organic film layer is removed, thereby causing step difference. Further, after the endpoint of etching is determined, overetching may be performed in order to remove residue from the substrate. However, in the case where the organic film layer is present on the substrate, or in the case where overetching is performed using etching gas containing fluorine-based gas, it is difficult to avoid the occurrence of substrate damage.

Further, JP-A-2008-216970 teaches that dry etching is performed in multi-steps for the purpose of avoiding substrate damage, and in the case where substrate is exposed by etching, the etching is performed without fluorocarbons, thereby realizing suppression of substrate damage. And, it is merely mentioned that pressure control is important for suppression of sidewall deposits. However, since pressure controllability contributes to suppression of sidewall deposits, there is a problem that likelihood of pressure parameters becomes narrow.

Patent Document 1: Japanese Patent Application Laid-Open No. 2003-332310

Patent Document 2: Japanese Patent Application Laid-Open No. 2008-216970

The present invention has been made in consideration of the above-mentioned problems, that is, an object of the present invention is to provide a method for manufacturing a color filter, in which substrate damage (shaving) can be suppressed while suppressing sidewall deposits in a broad range of parameters, and thus, difference between pattern width of a photoresist mask and pattern width of an organic film layer after dry etching (difference in pattern width change) can be reduced, and a color filter manufactured thereby.

SUMMARY OF INVENTION (1) A pattern forming method, including: forming an organic film layer on a substrate; forming a patterned photoresist mask on the organic film layer; and performing a dry etching process to form a pattern on the organic layer, wherein the dry etching process includes: (1) a first dry etching using a first mixed gas containing oxygen and a halogen compound gas to partially remove the organic film layer so that the surface of the substrate is not exposed, and to form a removed portion in the organic film layer according to a shape of the patterned photoresist mask; and (2) after the first dry etching step, a second dry etching using a second mixed gas containing: oxygen; a halogen compound gas of which gas flow rate ratio to oxygen is lower as compared with the gas flow rate ratio of the halogen compound in the first dry etching step; and at least one type of a third gas selected from the group consisting of $H_2$, $N_2$, $CH_4$ and CO, at a pressure of 8.0 Pa or less, so that the substrate under the organic film layer is exposed, wherein the flow rate of the halogen compound gas in the second dry etching is less than 1.0% of a total gas flow rate of the second mixed gas.

(2) The method of (1), wherein the flow rate of the halogen gas compound in the second dry etching is 0.15% or more of the total gas flow rate of the second mixed gas.

(3) The method of (1) or (2), wherein the second dry etching is performed at a pressure of 0.8 Pa to 8.0 Pa.

(4) The method of any one of (1) to (3), further including overetching after the second etching step.

(5) The method of any one of (1) to (4), wherein a difference between a pattern width of the photoresist mask and a pattern width of the organic film layer after the first and second dry etching is less than 0.2 μm.

(6) The method of any one of (1) to (5), wherein the surface of the substrate is dry etched in a depth of 0.05 μm or less in the thickness direction of the substrate.

(7) The method of any one of (1) to (6), further including stripping a remaining photoresist mask by dissolution.

(8) A method for manufacturing a color filter, including: forming an organic film layer on a substrate; forming a patterned photoresist mask on the organic film layer; and performing a dry etching process to form a pattern on the organic layer, wherein the dry etching process includes: (1) a first dry etching using a first mixed gas containing oxygen and a halogen compound gas to partially remove the organic film layer so that the surface of the substrate is not exposed, and to form a removed portion in the organic film layer according to a shape of the patterned photoresist mask; and (2) after the first dry etching step, a second dry etching using a second mixed gas containing: oxygen; a halogen compound gas of which gas flow rate ratio to oxygen is lower as compared with the gas flow rate ratio of the halogen compound in the first dry etching step; and at least one type of a third gas selected from the group consisting of $H_2$, $N_2$, $CH_4$ and $CO$, at a pressure of 8.0 Pa or less, so that the substrate under the organic film layer is exposed, wherein the flow rate of the halogen compound gas in the second dry etching is less than 1.0% of a total gas flow rate of the second mixed gas.

(9) A method for manufacturing a color filter, including: forming a first colored pattern using the method according to any one of (1) to (7); (i) forming an nth colored layer, wherein n is an integer of 2 or more, by filling a first recess of a surface side of the substrate where the first colored pattern is formed to form an nth colored pattern; (ii) dry etching the nth colored layer formed and the first colored pattern to form an unevenness pattern, and (iii) forming an (n+1)th colored layer by filling a second recess of a surface side of the substrate where the unevenness pattern is formed to form the (n+1)th colored pattern, (iv) repeating the (i), (ii) and (iii) at least once, and (v) removing an area not contributing to colored pattern formation of the nth colored layer by a photolithography treatment or a planarization treatment, wherein the first recess is formed when forming the first colored pattern and the second recess is formed when (ii) dry etching the nth colored layer and the first colored pattern.

(10) A color filter obtained by the method according to (8) or (9).

DESCRIPTION OF EMBODIMENTS

Figure 1:
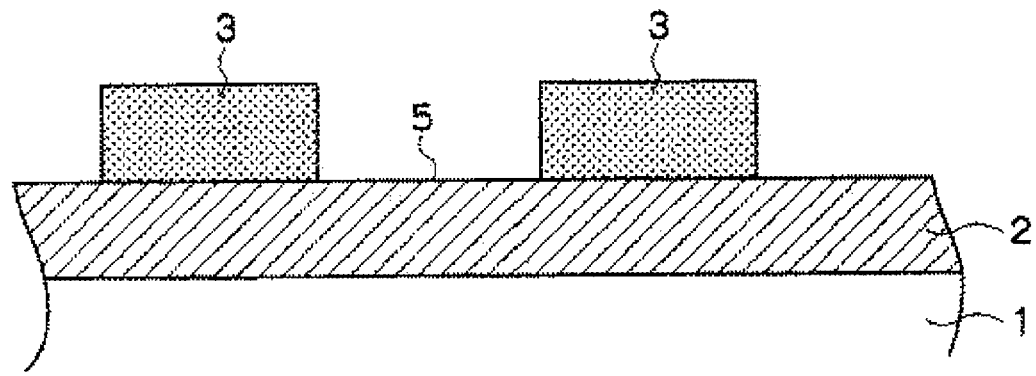
FIG. 1 is a schematic cross-sectional view illustrating a subject to be processed having an organic film layer on a substrate, and a patterned photoresist mask formed on the organic film layer.

In representation of a group (atomic group) in the present description, the representation which does not describe "substituted" and "unsubstituted" also includes a representation having substituents along with a representation having no substituent. For example, "an alkyl group" includes an alkyl group having no substituent (an unsubstituted alkyl group) and an alkyl group having substituents (a substituted alkyl group).

The explanation of constitutional requirements described hereinafter may be made based on the representative embodiment of the present invention, but the present invention is not limited to such an embodiment. Meanwhile, in the present specification, a numerical range represented by using "to" denotes a range including numerical values described before and after "to" as a lower limit and an upper limit.

Meanwhile, in the present specification, "(meth)acrylate" represents acrylate and methacrylate, "(meth)acryl" represents acryl and methacryl, and "(meth)acryloyl" represents acryloyl and methacryloyl. Further, in the present specification, "monomeric body" and "monomer" are synonymous with each other. In the present invention, monomer is differentiated from oligomer and polymer, and refers to a compound having a mass average molecular weight of less than 2,000. In the present specification, the polymerizable compound refers to a compound having a polymerizable group, and may be a monomer or a polymer. The polymerizable group refers to a group which is involved in a polymerization reaction.

<Pattern Forming Method and Method for Manufacturing a Color Filter>

The method for manufacturing a color filter of the present invention includes forming a pattern on an organic film layer by performing a dry etching process on a subject to be processed having the organic film layer on a substrate, and a patterned photoresist mask formed on the organic film layer, the dry etching process comprising:

(1) a first dry etching step of dry etching with a first mixed gas containing oxygen and a halogen compound gas to remove a portion of the organic film layer to the extent that the surface of the substrate is not exposed, and to form a removed portion of the organic film layer in the pattern shape of the photoresist mask, and (2) after the first dry etching step, a second dry etching step of dry etching with a second mixed gas containing oxygen, a halogen compound gas of which gas flow rate ratio to oxygen is reduced as compared with the gas flow rate ratio in the first dry etching step and at least one type of a third gas selected from the group consisting of $H_2$, $N_2$, $CH_4$ and $CO$, at a pressure of 8.0 Pa or less until the substrate under the organic film layer is exposed, wherein the flow rate of the halogen compound gas is less than 1.0% of the total gas flow rate of the second mixed gas.

The method for manufacturing a color filter of the present invention may secure a desired pattern thickness, color and color density, and is effective to manufacture a color filter for solid-state imaging devices requiring a micronize, such as, for example, a thickness of 1.0 μm or less and/or a pixel pattern size of 2 μm or less (for example, 0.5 μm to 2.0 μm).

—Formation of Organic Film Layer—

The organic film layer in the present invention may be formed, for example, by coating a curable composition as described below on a substrate as described below and drying the composition. Specifically, the curable composition may be formed on a substrate by a coating process such as spin coating. A specific thickness of the organic film layer is preferably 0.005 μm to 0.9 μm, more preferably 0.05 μm to 0.8 μm, and still more preferably 0.1 μm to 0.7 μm.

Preferably, the formation of the organic film layer in the present invention further includes a heating step (possibly post-bake step). Specifically, the organic film layer may be formed by coating a curable composition on a substrate to form a coating film, and then, heat curing the coating film by the heating step. The heating step may be performed simultaneously with drying after coating, or a heat curing step may be performed separately after coating and drying. The heating step may be performed using any known heating means such as an oven and a hot plate under conditions at a temperature of preferably 130° C. to 300° C., more preferably 150° C. to 280° C., and particularly preferably 170° C. to 260° C., for a time of preferably 10 seconds to 3 hours, more preferably 30 seconds to 2 hours, and particularly preferably 60 seconds to 60 minutes. However, considering the manufacture, a shorter curing time is preferred.

Furthermore, the organic film layer of the present invention may be a so-called transparent colored layer which does not contain a colorant. Specifically, the layer may be constituted in a composition in which the curing composition does not contain a colorant.

—Formation of Photoresist Mask—

In the formation of a photoresist mask, as illustrated in FIG. 1, a photoresist mask 3 is formed on an organic film layer 2 on a substrate 1. Specifically, a positive or negative type photosensitive composition is coated on the organic film layer 2, and dried to form a photoresist layer (not shown). Next, the photoresist layer is patterned by exposing and developing to form the photoresist mask 3. In forming the photoresist layer, it is preferred to perform a pre-baking again. In addition, post-exposure baking (PEB) and post-development baking (post-baking) may preferably preformed.

As a photoresist layer, for example, a positive type photosensitive resin composition is used. Examples of the positive type photosensitive resin composition include a positive type resist composition suitable for a positive type photoresist sensitive to radiations such as far-ultraviolet rays including ultraviolet rays (g-rays, h-rays and i-rays), excimer laser and the like, electron beam, ion beam and X-rays. Of radiations, g-rays, h-rays and i-rays are preferred, and among them, i-rays are more preferred.

Specifically, as the positive type photosensitive resin composition, a composition containing a quinonediazide compound and an alkali soluble resin is preferred. In the positive type photosensitive resin composition containing a quinonediazide compound and an alkali soluble resin, a quinonediazide group is decomposed by irradiating light having a wavelength of 500 nm or less to produce a carboxyl group, and as a result, the composition is converted from the alkali insoluble state to the alkali soluble state. The positive type photoresist mask has significantly excellent resolution, and thus, is used in the manufacture of an integrated circuit such as IC or LSI. Examples of the quinonediazide compound include naphthoquinonediazide compounds.

The thickness of the photoresist layer is preferably 0.1 μm to 3 μm, more preferably 0.2 μm to 2.5 μm, and still more preferably 0.3 μm to 2 μm. By thinning as far as possible with the thickness that does not impair the mask property when dry etching, the resolution may be enhanced when patterning.

An exposed portion 5 of the organic film layer is formed by forming the photoresist mask 3.

—Dry Etching Step—

Figure 2:
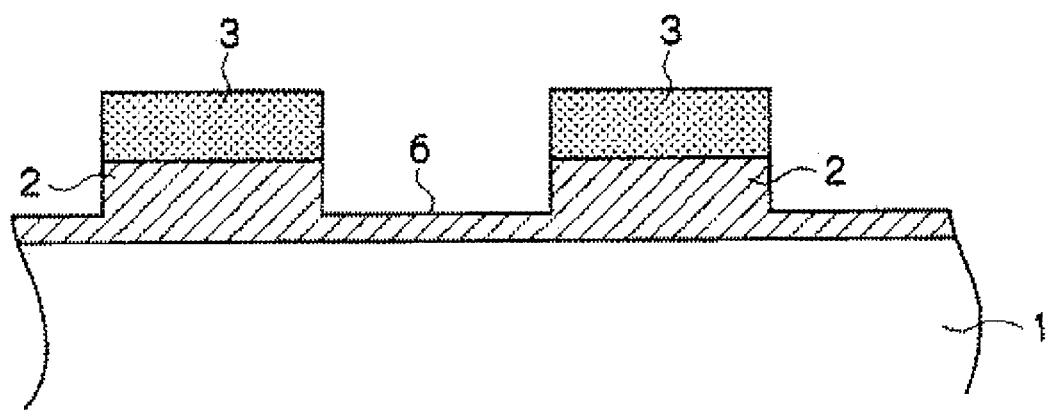
FIG. 2 is a schematic cross-sectional view illustrating a layer configuration after a first etching step.
Figure 3:
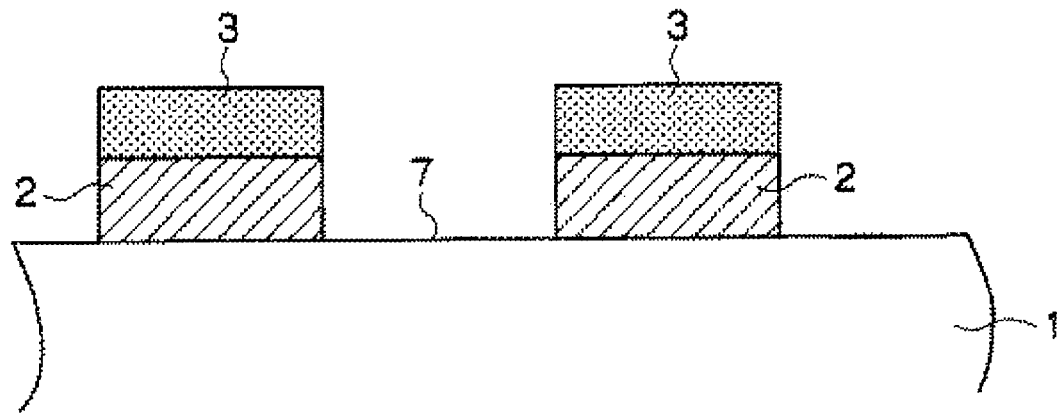
FIG. 3 is a schematic cross-sectional view illustrating a layer configuration after a second etching step.

From the viewpoint of suppressing a difference in pattern width change of the organic film layer after dry etching in relation to the pattern width of the photoresist mask, the viewpoint of forming the pattern cross-section in a shape closer to a rectangular shape or the viewpoint of reducing the damage to the support more than ever, the dry etching includes:

the first etching step in which etching is performed using a first mixed gas containing a halogen compound gas and an oxygen gas ($O_2$) up to a region (depth) where the surface of the substrate is not exposed in the exposed portion 5 of the organic film layer, thereby removing a part of the organic film layer 2 and forming a removed portion of the organic film layer 2 in the pattern shape of the photoresist mask 3, as illustrated in FIG. 2, and the second etching step in which etching is performed using a second mixed gas containing oxygen, a halogen compound gas and at least one gas selected from the group consisting of $H_2$, $N_2$, $CH_4$ and CO as a third gas, at a pressure of 8.0 Pa or less up to the vicinity of a region 7 (depth) where the substrate is exposed, as illustrated in FIG. 3.

In the second etching step, the gas flow rate ratio of the halogen compound gas to oxygen is reduced as compared with the gas flow rate ratio in the first dry etching step.

And, in the second etching step, the flow rate of the halogen compound gas is less than 1.0% of the total gas flow rate of the second mixed gas.

The lower limit of the flow rate of the halogen compound gas in the second etching step is preferably 0.15% or higher of the total gas flow rate of the second mixed gas.

Furthermore, it is preferred to include an overreacting step after the substrate is exposed.

The first mixed gas used in the first etching step contains a halogen compound gas and an oxygen gas ($O_2$) from the viewpoint of processing the organic film layer as a film to be etched in a rectangular form.

Herein, the halogen compound gas is preferably a gas composed of at least one compound having halogen atoms, and more preferably a gas composed of at least one compound having fluorine atoms, such as $CF_4$, $C_4F_8$, $C_2F_6$, $CHF_3$, $SF_6$ and $C_4F_6$.

In the first mixed gas used in the first etching step, the gas flow rate ratio of the halogen compound gas and the oxygen gas is preferably 2/1 to 8/1, more preferably 2/1 to 6/1, and particularly preferably 3/1 to 5/1.

In the first etching step, etching is performed up to the region where the substrate is not exposed, thereby avoiding damage of the substrate.

Further, in the second etching step and the overetching step, etching is performed using the first mixed gas up to the region where the substrate is not exposed, and then, from the viewpoint of avoiding damage of the substrate, etching is performed using a mixed gas of the third gas and the oxygen gas, or a gas in which the halogen compound gas is less than 1.0% of the total gas flow rate.

In the second etching step, the gas flow rate ratio of the halogen compound gas to oxygen is reduced as compared with the gas flow rate ratio in the first dry etching step, and thus, the organic film layer can be effectively etched without any damage to the substrate.

Specifically, the gas flow rate ratio of the halogen compound gas and the oxygen gas in the second etching step is preferably 1/30 to 1/1.5, more preferably 1/20 to 1/2, and particularly preferably 1/15 to 1/2.5.

Although the reason is not clear, by containing the specific thid gas in the second mixed gas in the second etching step, sidewall deposits remains to be properly attached on the sidewall, and thus, it is possible to suppress etching in a transverse direction of the organic film layer, thereby enhancing the rectangularity (verticality) of the pattern.

Here, the term "sidewall deposits" means etching products of nitrides or oxynitrides produced by etching process, which are attached and deposited on the sidewall of the organic film layer formed near the exposed portion of the substrate.

In view of the above, although the reason is not clear, it is possible to reduce the difference in pattern width change while suppressing substrate damage.

The above-described first etching step is performed preferably at a pressure of 4.0 Pa or less, and more preferably 2.0 Pa or less. When performed at a pressure of 4.0 Pa or less, it is possible to ensure that the rectangularity of the pattern is maintained in the first etching step.

Here, the pressure indicates an internal pressure of a chamber.

The second etching step is performed at a pressure of 8.0 Pa or less. When performed at a pressure of 8.0 Pa or less, it is possible to suppress etching in a transverse direction of the photoresist mask and the organic film layer. As a result, it is possible to minimize the difference in pattern width change between the photoresist mask and the organic film layer, and control the production of the sidewall deposits.

The lower limit of the pressure in the second etching step is preferably 0.8 Pa or more.

In the present invention, the second etching step is more preferably performed at a pressure of 0.8 Pa to 6.0 Pa.

The ratio of the etching amount in the first etching step and the etching amount in the second etching step is preferably determined such that the rectangularity by etching in the first etching step is not impaired. In addition, the ratio of the latter in the total etching amount (sum of the etching amount in the first etching step and the etching amount in the second etching step) is preferably greater than 0% to 50% or less, and more preferably 10% to 20%. The term "etching amount" means a film thickness that is disappeared by etching the film to be etched.

The dry etching is performed under the etching conditions previously obtained by the following technique.

(a) Each of an etching rate (nm/min) in the first dry etching step and an etching rate (nm/min) in the second dry etching step is calculated.

(b) Each of a time for etching a desired thickness in the first dry etching step and a time for etching a desired thickness in the second dry etching step is calculated.

(c) The first dry etching step is performed according to the etching time calculated in (b).

(d) The second dry etching step is performed according to the etching time calculated in (b). Otherwise, the etching time may be determined from the detection of an end point to perform the second dry etching step according to the etching time determined (e) An overetching time is calculated for the total time of (c) and (d) to perform the overetching.

Further, the etching preferably includes the overetching step after the second etching step. The overetching step is preferably performed by setting an overetching ratio. However, the overetching may be performed after detecting exposure of the substrate by an end point detector which is able to detect exposure of the substrate. The overetching ratio may be arbitrarily set, but is preferably 30% or less of the etching treatment time in the etching process, more preferably 5% to 25% and particularly preferably 10% to 15% from the viewpoint of maintaining the etching resistance of the photoresist and the rectangularity of a pattern to be etched.

In addition, the overetching may be performed using an end point detector (EPD) which is able to detect exposure of the substrate. After detecting exposure of the substrate by the EPD during the second etching, etching may be further performed, and overetching may be performed in a predetermined overetching ratio.

According to the present invention, specifically, the difference between the pattern width in the photoresist mask and the difference in pattern width of the organic film layer after the first and second dry etching steps (difference in pattern width change) may be set to less than 0.2 μm.

In addition, the substrate damage (amount to be dry etched from the surface of the substrate) may be set to 0.05 μm or less in the thickness direction of the substrate.

—Photoresist Mask Removing Step—

The method for manufacturing a color filter of the present invention preferably further includes stripping the remaining photoresist mask by dissolution.

Figure 4:
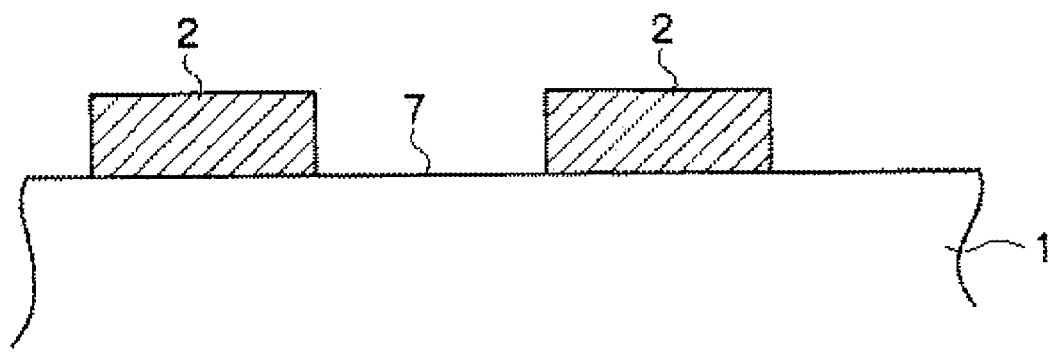
FIG. 4 is a schematic cross-sectional view illustrating a layer configuration after removal of the photoresist mask.

As illustrated in FIG. 4, the photoresist mask (that is, etching mask), which remains after etching, is removed in the photoresist mask removing step. The removal of the photoresist mask preferably includes imparting a stripping solution or a solvent on the photoresist mask to make a state capable of removing the photoresist mask, and removing the photoresist mask using washing water.

Examples of the step of imparting a stripping solution or a solvent on the photoresist mask to make a state capable of removing the photoresist mask include a step of imparting a stripping solution or a solvent at least on the photoresist mask and allowing the stripping solution or the solvent to stand for a predetermined time to perform a puddle development. A time for allowing the stripping solution or the solvent to stand is not particularly limited, but is preferably several dozen seconds to several minutes.

As an organic solvent, one or more mixed solvents selected from propylene glycol monomethyl ether acetate (PGMEA), propylene glycol monomethyl ether (PGME), cyclohexanone, ethyl 3-ethoxypropionate (EEP), butyl acetate, isopropanol (IPA), acetone and the like may be used. The organic solvent is not limited thereto, but may be any known organic solvent employed in semiconductor manufacturing factories.

The stripping solution generally contains an organic solvent, but may further contain an inorganic solvent. Examples of the organic solvent include 1) hydrocarbon-based compounds, 2) halogenated hydrocarbon-based compounds, 3) alcohol-based compounds, 4) ether- or acetal-based compounds, 5) ketone- or aldehyde-based compounds, 6) ester-based compounds, 7) polyhydric alcohol-based compounds, 8) carboxylic acid or carboxylic anhydride-based compounds, 9) phenolic compounds, 10) nitrogen-containing compounds, 11) sulfur-containing compounds and 12) fluorine-containing compounds. The stripping solution preferably contains a nitrogen-containing compound and more preferably includes an acyclic nitrogen-containing compound and a cyclic nitrogen-containing compound.

The acyclic nitrogen-containing compound is preferably an acyclic nitrogen-containing compound having a hydroxyl group. Specific examples thereof include monoisopropanolamine, diisopropanolamine, triisopropanolamine, N-ethylethanolamine, N,N-dibutylethanolamine, N-butylethanolamine, monoethanolamine, diethanolamine, triethanolamine and the like, monoethanolamine, diethanolamine and triethanolamine are preferred and monoethanolamine ($H_2NCH_2CH_2OH$) is more preferred. Further, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-pipecholine, 3-pipecholine, 4-pipecholine, piperazine, piperidine, pyrazine, pyridine, pyrrolidine, N-methyl-2-pyrrolidone, N-phenylmorpholine, 2,4-lutidine, 2,6-lutidine and the like.

Further, the present invention preferably includes volatilizing the stripping solution and the organic solvent absorbed in or adsorbed on the organic film layer after the photoresist mask stripping step. As the volatilizing step, heat treatment or devolatilizing treatment may be applied, but preferably, dehydrating bake by heat treatment using a hot plate or an oven may be preferably employed.

In the method of manufacturing a color filter of the present invention, a color filter array may be constructed by forming a colored layer again after the second layer, following the first organic layer forming step and the first pattern forming step.

As one aspect, in the method for manufacturing a color filter of the present invention, the pattern formed by a step of forming a pattern on the organic film layer by performing the first and second dry etching steps is a first colored pattern, and after the first colored pattern is formed, the method further includes:

(i) forming an nth colored layer (n≥2) so as to fill a recess of a surface side of the substrate where the first colored pattern is formed, thereby forming an nth colored pattern in the portion filling the recess, (ii) dry etching the formed nth colored layer and the first colored pattern, and forming an unevenness pattern in order to form an (n+1)th colored pattern (n≥2), and (iii) forming an (n+1)th colored layer so as to fill a recess of a surface side of the substrate where the unevenness pattern is formed, thereby forming an (n+1)th colored pattern in the portion filling the recess, (iv) repeating the steps (i), (ii) and (iii) at least once, and (v) removing a portion not contributing to colored pattern formation of the nth (n≥2) colored layer formed on the surface side of the substrate where the first colored pattern is formed (the portion filling each recess is regarded as a portion contributing to colored pattern formation by forming each colored pattern) by a photolithography treatment or a planarization treatment. Accordingly, color filter including colored patterns of n+1 colors is preferably formed.

As the planarization treatment, from the viewpoint of simplification of the preparation processes or preparation costs, a polishing treatment such as an etch back treatment for dry etching the entire surface, a chemical mechanical polishing (CMP) for chemically and mechanically polishing the entire surface may be used.

The dry etching in the (n+1)th pattern forming step of forming an unevenness pattern for forming the (n+1)th (n≥2) colored pattern may also be performed by the first and second dry etching steps related to the present invention.

Each of steps (i), (ii) and (iii) is preferably performed in one to three cycles (that is, n is 2 to 4). Each of steps (i), (ii) and (iii) is more preferably performed in one or two cycles (that is, n is 2 or 3). Each of steps (i), (ii) and (iii) is still more preferably performed in one cycle (that is, n is 2).

<Substrate>

The substrate in the present invention is not particularly limited, and examples thereof include soda-lime glass used in a liquid crystal display device and the like, borosilicate glass, quartz glass and a product obtained by attaching a transparent conductive film thereto, or a photoelectric conversion device substrate used in an imaging device and the like, for example, an oxide film, silicon nitride and the like. Further, an intermediate layer and the like may be installed between the substrate and the organic film layer so long as the present invention is not impaired.

<Organic Film Layer>

The organic film layer in the present invention may constitute at least one kind of pixels of the color filter in the present invention. The organic film layer in the present invention is preferably formed by a curable composition containing a colorant. Examples of the curable composition include a photocurable composition and a non-photosensitive heat curable composition. The organic film layer in the present invention is preferably formed by using a non-photosensitive heat curable composition from the viewpoint of spectral characteristics.

<Curable Composition>

(Colorant Containing Heat Curable Composition)

In the present invention, a colored layer may be formed by using a non-photosensitive heat curable composition. The colorant containing non-photosensitive heat curable composition preferably contains a colorant and a heat curable compound. The content of the colorant in the total solids is preferable from 50% by mass to less than 100% by mass.

—Colorant—

The colorant which can be used in the present invention is not particularly limited, and a mixture of one or two or more of various dyes or pigments known in the related art may be used.

Examples of the pigment which can be used in the present invention include various inorganic pigments or organic pigments known in the art. Further, when considering that any of inorganic pigments or organic pigments preferably has a high transmittance, it is preferred to use a pigment having as small an average particle diameter as possible, and when the handling ability is considered, the average particle diameter of the pigment is preferably 0.01 µm to 0.1 µm, and more preferably 0.01 µm to 0.05 µm.

Pigments which may be preferably used in the present invention are as follows. However, the present invention is not limited thereto.

C.I. Pigment Yellow 11, 24, 108, 109, 110, 138, 139, 150, 151, 154, 167, 180, 185;

C.I. Pigment Orange 36, 71;

C.I. Pigment Red 122, 150, 171, 175, 177, 209, 224, 242, 254, 255, 264;

C.I. Pigment Violet 19, 23, 32;

C.I. Pigment Blue 15:1, 15:3, 15:6, 16, 22, 60, 66;

C.I. Pigment Green 36, 7, 58

In the present invention, when the colorant is a dye, a non-photosensitive heat curable composition may be obtained by uniformly dissolving in the composition The dye which can be used as a colorant constituting the composition of the present invention is not particularly limited, and a dye for a color filter known in the related art may be used.

As the chemical structure, dyes such as pyrazole azo-based, anilino azo-based, triphenylmethane-based, anthraquinone-based, anthrapyridone-based, benzilidene-based, oxonol-based, pyrazolotriazole azo-based, pyridone azo-based, cyanine-based, phenothiazine-based, pyrrolo pyrazole azomethine-based, xanthene-based, phthalocyanine-based, benzopyran-based and indigo-based dyes may be used.

The content of the colorant of the present invention is not particularly limited, but is preferably from 50% by mass to less than 100% by mass or more, and more preferably 55% by mass to 90% by mass, based on the total solids of the curable composition. When the content is 50% by mass or more, it is possible to obtain proper colors for a color filter. In addition, when the content is less than 100% by mass, curing may be sufficiently processed, and thus, the reduction in strength as a film may be suppressed.

—Heat Curable Compound—

The heat curable compound which can be used in the present invention is not particularly limited so long as film curing can be performed by heating, and examples thereof include a compound having heat curable functional groups. The heat curable compound preferably has at least one group selected from, for example, an epoxy group, a methylol group, an alkoxymethyl group and an acyloxymethyl group.

More preferred heat curable compound may include (a) an epoxy compound, (b) a melamine compound, a guanamine compound, a gycoluryl compound or an urea compound, which are substituted with at least one substituent selected from a methylol group, an alcoxymethyl group and an acyloxymethyl group, (c) a phenol compound, a naphthol compound or a hydroxyanthracene compound substituted with at least one substituent selected from a methylol group, an alcoxymethyl group and an acyloxymethyl group. Among them, a polyfunctuional epoxy compound is particularly preferred as the heat curable compound.

The total content of the heat curable compound in the curable composition may vary depending on the material, but is preferably 0.1% by mass to 50% by mass, more preferably 0.2% by mass to 40% by mass, and particularly preferably 1% by mass to 35% by mass, based on the total solids (mass) of the curable composition.

—Various Additives—

In the curable composition of the present invention, various additives, for example, a binder, a curing agent, a curing catalyst, a solvent, a filler, a polymer compound other than those described above, a polymerizable compound, a polymerization initiator, a surfactant, an adhesion promoter, an antioxidant, a UV absorbent, an aggregation inhibitor, a dispersant and the like may be blended, if necessary, in a range where the effect of the present invention is not impaired.

~Binder~

The binder is often added during the preparation of a pigment dispersion liquid, does not need alkali solubility, is soluble only in an organic solvent, and therefore, has a property maintaining dispersion stability and curability As the binder, a linear organic high polymer which is soluble in an organic solvent is preferred. Examples of the linear organic high polymer include polymers having carboxylic acid at the side chain thereof, and methacrylic acid copolymers, acrylic acid copolymers, itaconic acid copolymers, crotonic acid copolymers, maleic acid copolymers, partially esterified maleic acid copolymers and the like as described in, for example, Japanese Patent Application Laid-Open No. S59-44615, Japanese Patent Publication No. S54-34327, Japanese Patent Publication No. S58-12577, Japanese Patent Publication No. S54-25957, Japanese Patent Application Laid-Open No. S59-53836 and Japanese Patent Application Laid-Open No. S59-71048, and an acidic cellulose derivative similarly having carboxylic acid at the side chain thereof is also useful.

Among these various binders, polyhydroxystyrene-based resins, polysiloxane-based resins, acrylic resins, acrylamide-based resins and acrylic/acrylamide copolymer resins are preferred from the viewpoint of heat resistance, and acrylic resins, acrylamide-based resins and acrylic/acrylamide copolymer resins are preferred from the viewpoint of control of developing property.

As the acrylic resin, copolymers containing a monomer selected from benzyl(meth)acrylate, (meth)acrylic acid, hydroxyethyl(meth)acrylate, (meth)acrylamide and the like, for example, each copolymer such as benzyl methacrylate/methacrylic acid and benzyl methacrylate/benzyl methacrylamide, KS RESIST-106 (manufactured by Osaka Organic Chemical Industry Ltd.) and CYCLOMER-P SERIES (manufactured by Daicel Corporation) are preferred.

Adhesion to the lower layer and the like may be imparted by dispersing the above-mentioned colorant in these binders at high concentration, and these binders also contribute to the coated surface shape during spin-coating.

~Curing Agent~

In the present invention, when an epoxy resin is used as a heat curable compound, a curing agent is preferably added. A curing agent for an epoxy resin has a very wide variety, and property, a working life for a mixture of the resin and the curing agent, viscosity, a curing temperature, a curing time, heat generation and the like vary greatly depending on the kind of the curing agent to be used, and thus it is required to select an appropriate curing agent depending on application purpose, service conditions, working conditions of the curing agent and the like. The curing agent is explained in detail in "Epoxy Resin (SHOKODO)" edited by Kakiuchi Hiroshi, Chapter 5. Hereinafter, examples of the curing agent will be shown.

Examples of a curing agent acting catalytically include tertiary amines and boron trifluoride-amine complex, and examples of a curing agent reacting stoichiometrically with a functional group of the epoxy resin include polyamine, acid anhydride and the like; further, examples of a curing agent performing curing at room temperature include diethylenetriamine and polyamide resin, and examples of a curing agent performing curing at medium temperature include diethylaminopropylamine and tris(dimethylaminomethyl)phenol; and examples of a curing agent performing curing at high temperature include anhydrous phthalic acid, meta-phenylenediamine and the like. In addition, in terms of chemical structure, for amines, examples of aliphatic polyamine include diethylenetriamine; examples of aromatic polyamine include meta-phenylenediamine; examples of tertiary amine include tris(dimethylaminomethyl)phenol; examples of acid anhydride include anhydrous phthalic acid, a polyamide resin, a polysulfide resin and a boron trifluoride-monoethylamine complex; and examples of a synthetic resin initial condensate include a phenolic resin, dicyandiamide and the like.

These curing agents react and polymerize with an epoxy group by heating, and thus the crosslink density is increased to achieve curing. Both the binder and the curing agent are preferably as small in amount as possible for achieving a thin film, and particularly, the curing agent is 35% by mass or less, preferably 30% by mass or less, and more preferably 25% by mass or less based on the heat curable compound.

~Curing Catalyst~

In the present invention, curing by reaction of epoxy mainly with each other in addition to curing by reaction with the curing agent is effective for realizing high concentration of the organic agent. For this reason, a curing catalyst may also be used without using the curing agent. The curing may be performed by as slight an amount as the added amount of the curing catalyst approximately 1/10 to 1/1000, preferably approximately 1/20 to 1/500, and more preferably approximately 1/30 to 1/250 on the basis of mass based on an epoxy resin with an epoxy equivalent weight of approximately 150 to 200.

~Solvent~

The curable composition in the present invention may be used as a solution in which the compound is dissolved in various solvents. Basically, each solvent used in the curable composition in the present invention is not particularly limited so long as the solubility of each component and the applicability of the curable composition are satisfied.

~Dispersant~

The dispersant may be added in order to enhance the dispersability of pigments. Any known dispersants may be suitably used as the dispersant, and examples thereof include cationic surfactants, fluorine-based surfactants, polymeric dispersants and the like.

Various compounds are used as the dispersant, and examples thereof include a phthalocyanine compound (trade name: EFKA-745, manufactured by EFKA); SOLSPERSE 5000 (manufactured by Lubrizol Japan Ltd.); cationic surfactants such as organosiloxane polymer KP341 (manufactured by Shin-Etsu Chemical Co., Ltd.), (meth)acrylic (co)polymers POLYFLOW No. 75, No. 90 and No. 95 (manufactured by Kyoeisha Chemical Co., Ltd.) and W001 (manufactured by Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters or Pionin D-6315 (manufactured by Takemoto Oil & Fat Co., Ltd.); anionic surfactants such as W004, W005 and W017 (manufactured by Yusho Co., Ltd.); fluorine-based surfactants such as Megaface F781 (manufactured by DIC Corporation); polymeric dispersants such as BYK-2001 (manufactured by BYK Chemie), EFKA-46, EFKA-47, EFKA-47EA, EFKAPOLYMER 100, EFKAPOLYMER 400, EFKAPOLYMER 401 and EFKAPOLYMER 450 (all manufactured by Morishita & Co., Ltd.), and DISPERSE AID 6, DISPERSE AID 8, DISPERSE AID 15 and DISPERSE AID 9100 (manufactured by San Nopco Ltd.); various SOLSPERSE dispersants such as SOLSPERSE 3000, 5000, 9000, 12000, 13240, 13940, 17000, 24000, 26000 and 28000 (manufactured by Lubrizol Japan Ltd.); ADEKAPLURONIC L31, F38, L42, L44, L61, L64, F68, L72, P95, F77, P84, F87, P94, L101, P103, F108, L121, P-123 (manufactured by Asahi Denka K.K.); and ISONET S-20 (manufactured by Sanyo Chemical Industries Ltd.).

The dispersant may be used either alone or in combination of two or more thereof. The dispersant in the invention is usually added preferably to the coloring heat curable composition in an amount of about 0.1 parts by mass to 50 parts by mass based on 100 parts by mass of the pigment.

~Polymerizable Compound~

The curable composition of the present invention may be properly composed by containing at least one polymerizable compound. The polymerizable compound is contained mainly when the curable compound is a negative type.

Specifically, the polymerizable compound is selected from compounds having at least one terminal ethylenically unsaturated bond and preferably two or more terminal ethylenically unsaturated bonds. The group of these compounds is widely known in the relevant industrial field, and such compounds may be used in the present invention without particular limitations. These compounds may be any of chemical forms such as, for example, a monomer, a prepolymer, that is, a dimer, a trimer, and an oligomer, or a mixture thereof, and a multimer thereof. The polymerizable compounds in the present invention may be used either alone or in combination of two or more thereof.

More specifically, examples of monomers and prepolymers thereof include an unsaturated carboxylic acid (for example, acrylic acid, methacrylic acid, itaconic acid, crotonic acid, isocrotonic acid, maleic acid and the like), esters and amides thereof and multimers thereof, and esters of an unsaturated carboxylic acid and an aliphatic polyhydric alcohol compound, amides of an unsaturated carboxylic acid and an aliphatic polyvalent amine compound, and multimers thereof. Further, an addition reaction product of unsaturated carboxylic acid esters or unsaturated carboxylic acid amides, which have a nucleophilic substituent such as a hydroxyl group, an amino group and a mercapto group, with monofunctional or polyfunctional isocyanates or epoxies, a dehydration condensation reaction product of the unsaturated carboxylic acid esters or unsaturated carboxylic acid amides with a monofunctional or polyfunctional carboxylic acid, and the like are also suitably used. In addition, an addition reaction product of unsaturated carboxylic acid esters or unsaturated carboxylic acid amides, which have an electrophilic substituent such as an isocyanate group and an epoxy group, with monofunctional or polyfunctional alcohols, amines or thiols; and furthermore, a substitution reaction product of unsaturated carboxylic acid esters or unsaturated carboxylic acid amides, which have a releasable substituent such as a halogen group and a tosyloxy group, with monofunctional or polyfunctional alcohols, amines or thiols, are also suitably used. Furthermore, as another example, it is also possible to use the group of compounds obtained by replacing the above-described unsaturated carboxylic acid with a vinyl benzene derivative such as an unsaturated phosphonic acid and styrene, vinyl ether, allyl ether and the like.

As the specific compounds thereof, the compounds as described in paragraph Nos. [0095] to [0108] of Japanese Patent Application Laid-Open No. 2009-288705 may be suitably used even in the present invention.

Further, as the polymerizable compound, a compound having an ethylenically unsaturated group with a boiling temperature of 100° C. or more under normal pressure, which has at least one addition polymerizable ethylene group, is also preferred. Examples thereof include monofunctional acrylates or methacrylates such as polyethylene glycol mono (meth)acrylate, polypropylene glycol mono(meth)acrylate, phenoxyethyl(meth)acrylate and the like; compounds obtained by adding ethylene oxide or propylene oxide to polyfunctional alcohols such as polyethylene glycol di(meth) acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth) acrylate, dipentaerythritol hexa(meth)acrylate, hexanediol (meth)acrylate, trimethylolpropane tri(acryloyloxyethyl) ether, tri(acryloyloxyethyl) isocyanurate, glycerine or trimethylolethane, followed by (meth)acrylation, urethane (meth)acrylates as described in Japanese Patent Publication Nos. S48-41708 and S50-6034 and Japanese Patent Application Laid-Open No. 51-37193, polyester acrylates as described in Japanese Patent Application Laid-Open No. S48-64183 and Japanese Patent Publication Nos. S49-43191 and S52-30490, polyfunctional acrylates or methacrylates such as epoxy acrylates as a reaction product obtained by reacting epoxy resins with (meth)acrylic acid, and mixtures thereof.

Examples thereof include polyfunctional (meth)acrylates obtained by reacting a cyclic ether group such as glycidyl (meth)acrylate with a compound having an ethylenically unsaturated group in a polyfunctional carboxylic acid, and the like.

In addition, as the other preferred polymerizable compound, it is also possible to use a compound having a fluorene ring and having two or more ethylenically unsaturated functional groups, as described in Japanese Patent Application Laid-Open Nos. 2010-160418 and 2010-129825 and Japanese Patent No. 4364216, and cardo resins.

Furthermore, as the compound having at least one ethylenically unsaturated group, which is addition polymerizable, and having a boiling point of 100° C. or more under normal pressure, the compounds as described in paragraph Nos. [0254] to [0257] of Japanese Patent Application Laid Open No. 2008-292970 are also suitable.

In addition to the compounds described above, radical polymerizable monomers represented by the following Formulas (MO-1) to (MO-5) may also be suitably used. Meanwhile, in the formulas, when T is an oxyalkylene group, R is bonded to the terminal end of the carbon atom side thereof

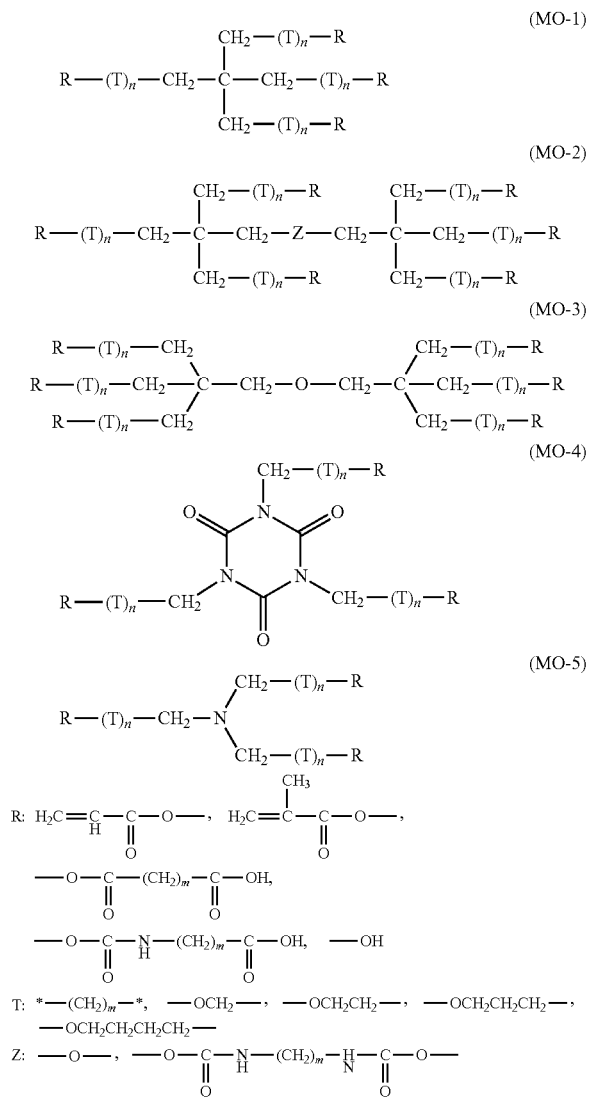

In the Formulas, n is 0 to 14, and m is 1 to 8. Each of R and T present in plurality in a molecule may be the same as or different from every other R and T.

In each of the radical polymerizable monomers represented by Formulas (MO-1) to (MO-5), at least one of a plurality of Rs represents a group represented by —OC(=O)CH=CH$_2$ or —OC(=O)C(CH$_3$)=CH$_2$.

As specific examples of the radical polymerizable monomers represented by Formulas (MO-1) to (MO-5), the compounds as disclosed in paragraph Nos. [0248] to [0251] of Japanese Patent Application Laid-Open No. 2007-269779 may be suitably used even in the present invention.

Further, the compounds, described as a compound of Formula (1) and (2) together with specific examples thereof in Japanese Patent Application Laid-Open No. H10-62986, which are obtained by adding ethylene oxide or propylene oxide to the polyfunctional alcohol followed by (meth)acrylation may be also used as the polymerizable compound.

Among them, RP1040 (manufactured by NIPPON KAYAKU Co., Ltd.), dipentaerythritol triacrylate (trade name: KAYARAD D-330; manufactured by NIPPON KAYAKU Co., Ltd.), dipentaerythritol tetraacrylate (trade name: KAYARAD D-320; manufactured by NIPPON KAYAKU Co., Ltd.), dipentaerythritol penta(meth)acrylate (trade name: KAYARAD D-310; manufactured by NIPPON KAYAKU Co., Ltd.), dipentaerythritol hexa(meth)acrylate (trade name: KAYARAD DPHA; manufactured by NIPPON KAYAKU Co., Ltd.) and a structure in which the (meth)acryloyl group thereof intervenes in an ethylene glycol or propylene glycol reside are preferred as the polymerizable compound. The oligomer types thereof may also be used.

In the present invention, a monomer having an acid group is an ester of an aliphatic polyhydroxy compound with an unsaturated carboxylic acid and is preferably a polyfunctional monomer which is allowed to have an acid group by reacting a non-aromatic carboxylic anhydride with an unreacted hydroxyl group of an aliphatic polyhydroxy compound, and the aliphatic polyhydroxy compound is particularly preferably pentaerythritol and/or dipentaerythritol in the ester. Examples of the commercially available product include polybasic acid modified-acrylic oligomers produced by TOAGOSEI CO., LTD., such as M-510 and M-520.

These monomers may be used alone, but may be used in mixture of two or more thereof because it is difficult to use a single compound in the preparation. Further, if necessary, a polyfunctional monomer which has no acid group as a monomer may be used in combination with a polyfunctional monomer which has an acid group.

The polyfunctional monomer which has an acid group preferably has an acid number of 0.1 mg KOH/g to 40 mg KOH/g, and particularly preferably 5 mg KOH/g to 30 mg KOH/g. If the acid number of the polyfunctional monomer is too low, the developing and dissolving properties are deteriorated. If the acid number is too high, it is difficult to manufacture or handle, and the performance of photopolymerization is deteriorated, thereby deteriorating the curability such as the surface smoothness of pixels. Accordingly, when the polyfunctional monomers having another acid group are used in combination of two or more thereof, or the polyfunctional monomers which have no acid group are used in combination, it is preferred to adjust the acid number such that the acid group as the total polyfunctional monomer falls within the above-described range.

In addition, it is a preferred aspect that a polyfunctional monomer having a caprolactone structure is contained as a polymerizable monomer.

The polyfunctional monomer having a caprolactone structure is not particularly limited so long as the monomer has a caprolactone structure in the molecule thereof, but examples thereof include ε-caprolactone modified polyfunctional (meth)acrylates obtainable by esterification of a polyhydric alcohol such as trimethylolethane, ditrimethylolethane, trimethylolpropane, ditrimethylolpropane, pentaerythritol, dipentaerythritol, tripentaerythritol, glycerine, diglycerol and trimethylolomelamine, and (meth)acrylic acid and ε-caprolactone. Among them, a polyfunctional monomer having a caprolactone structure represented by the following Formula (i) is preferred.

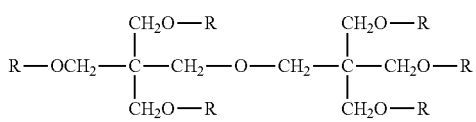

(1)

In the formula, all of six Rs are a group represented by the following Formula (2), or 1 to 5 of six Rs are a group represented by the following Formula (2) and the remainder thereof is a group represented by the following Formula (3).

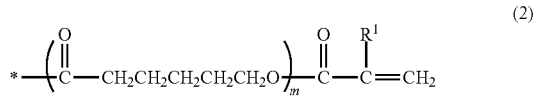

(2)

In the formula, $R^1$ represents a hydrogen atom or a methyl group, m represents a number of 1 or 2, and "*" represents a bonding hand.

(3)

In the formula, $R^1$ represents a hydrogen atom or a methyl group, and "*" represents a bonding hand.

The polyfunctional monomer having such a caprolactone structure is commercially available, for example, as KAYARAD DPCA series from NIPPON KAYAKU Co., Ltd., and examples thereof include DPCA-20 (in Formulas (1) to (3), a compound in which m=1, the number of groups represented by Formula (2)=2, and all of R's are a hydrogen atom), DPCA-30 (in the same formulas, a compound in which m=1, the number of groups represented by Formula (2)=3, and all of $R^1$s are a hydrogen atom), DPCA-60 (in the same formulas, a compound in which m=1, the number of groups represented by Formula (2)=6, and all of $R^1$s are a hydrogen atom), DPCA-120 (in the same formulas, a compound in which m=2, the number of groups represented by Formula (2)=6, and all of R's are a hydrogen atom) and the like.

In the present invention, a polyfunctional monomer having a caprolactone structure may be used either alone or in combination of two or more thereof.

Further, as a polyfunctional monomer in the present invention, at least one selected from the group of the compound represented by the following Formula (i) and Formula (ii) is also preferred.

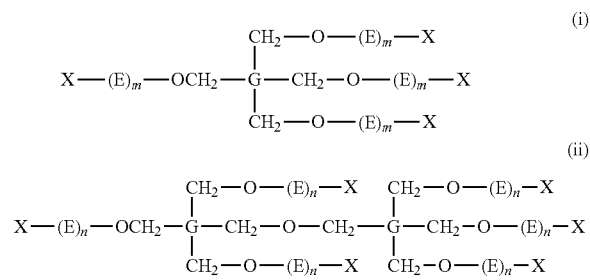

In Formula (i) and Formula (ii), each of E independently represents —$((CH_2)_yCH_2O)$— or —$((CH_2)_yCH(CH_3)O)$—, each of y independently represents an integer of 0 to 10, each of X independently represents an acryloyl group, a methacryloyl group, a hydrogen atom or a carboxyl group.

In Formula (i), the sum of an acryloyl group and a methacryloyl group is 3 or 4, each of m independently represents an integer of 0 to 10, and the sum of each m is an integer of 0 to 40. However, when the sum of each m is 0, any one of X is a carboxyl group.

In Formula (ii), the sum of an acryloyl group and a methacryloyl group is 5 or 6, each of n independently represents an integer of 0 to 10, and the sum of each n is an integer of 0 to 60. However, when the sum of each n is 0, any one of X is a carboxyl group.

In Formula (i), m is preferably an integer of 0 to 6, and more preferably an integer of 0 to 4.

Further, the sum of each m is preferably an integer of 2 to 40, more preferably an integer of 2 to 16, and particularly preferably an integer of 4 to 8.

In Formula (ii), n is preferably an integer of 0 to 6, and more preferably an integer of 0 to 4.

In addition, the sum of each n is preferably an integer of 3 to 60, more preferably an integer of 3 to 24, and particularly preferably an integer of 6 to 12.

Furthermore, —$((CH_2)_yCH_2O)$— or —$((CH_2)_yCH(CH_3)O)$— in Formula (i) or Formula (ii) is preferably a form in which X is bonded to the terminal end of the oxygen atom side.

The compound represented by Formula (i) or Formula (ii) may be used either alone or in combination of two or more thereof. In particular, in Formula (ii), an embodiment in which all of the six Xs are an acrylolyl group is preferred.

In addition, the total content of the compound represented by Formula (i) or Formula (ii) in the specific monomer is preferably 20% by mass or more, and more preferably 50% by mass or more.

The compound represented by Formula (i) or Formula (ii) may be synthesized by a process of bonding a ring-opening structure of ethylene oxide or propylene oxide to pentaerythritol or dipentaerythritol by means of a ring-opening addition reaction and a process of reacting, for example, (meth)acryloylchloride with a terminal hydroxyl group of the ring-opening structure to introduce a (meth)acryloyl group, which are processes known in the related art. Each process is a well known process, and the compound represented by Formula (i) or Formula (ii) may be readily synthesized by those skilled in the art.

Even among the compositions represented by Formula (i) or Formula (ii), pentaerythrol derivatives and/or dipentaerythritol derivatives are more preferred.

Specifically, examples thereof include compounds (hereinafter, also referred to as "exemplary compounds (a) to (f)") represented by the following formulas (a) to (f) and among them, exemplary compounds (a), (b), (e) and (f) are preferred.

(a)

$$CH_2=CH-\underset{\underset{O}{\|}}{C}-(O-CH_2-CH_2)_n-O-CH_2$$
$$CH_2=CH-\underset{\underset{O}{\|}}{C}-(O-CH_2-CH_2)_n-O-CH_2-\underset{|}{C}-CH_2-O-CH_2-\underset{|}{C}-CH_2-O-(CH_2-CH_2-O)_n-\underset{\underset{O}{\|}}{C}-CH=CH_2$$
$$CH_2=CH-\underset{\underset{O}{\|}}{C}-(O-CH_2-CH_2)_n-O-CH_2 \qquad CH_2-O-(CH_2-CH_2-O)_n-\underset{\underset{O}{\|}}{C}-CH=CH_2$$

(The sum of each of n is 6)

(b)

(The sum of each of n is 12)

(c)

(The sum of each of n is 12)

(d)

(The sum of each of n is 6)

(e)

(The sum of each of n is 4)

(f)

(The sum of each of n is 2)

Examples of the commercially available product of the specific monomers represented by Formula (i) and Formula (ii) include a tetrafunctional acrylate having four ethyleneoxy chains, SR-494, manufactured by Sartomer Company, Inc., and a hexafunctional acrylate having six pentyleneoxy chains, DPCA-60 and a trifunctional acrylate having three isobutyleneoxy chains, TPA-330, which are both manufactured by Nippon Kayaku Co., Ltd.

Further, as a polymerizable compound, urethane acrylates as described in Japanese Patent Publication No. S48-41708, Japanese Patent Application Laid-Open Publication No. S51-37193, Japanese Patent Publication Nos. H2-32293 and H2-16765, or urethane compounds having an ethyleneoxide-based structure, as described in Japanese Patent Publication Nos. S58-49860, S56-17654, S62-39417 and S62-39418 are also suitable. Further, a curable composition having excellent photosensitive speed may be obtained by using addition polymerizable compounds having an amino structure or a sulfide structure in a molecule, as described in Japanese Patent Application Laid-Open Publication Nos. S63-277653, S63-260909, and H1-105238, as a polymerizable compound.

Examples of the commercially available product of the polymerizable compound include urethane oligomers UAS-10, UAB-140 (manufactured by Sanyo-Kokusaku Pulp Co., Ltd.), UA-7200 (manufactured by SHIN-NAKAMURA CHEMICAL CO., LTD.) DPHA-40H (manufactured by NIPPON KAYAKU Co., Ltd.), UA-306H, UA-306T, UA-306I, AH-600, T-600, AI-600 (manufactured by KYOEISHA CHEMICAL CO., LTD.), and the like.

In addition, ethylenically unsaturated compounds having an acid group are also suitable as the polymerizable compound.

The ethylenically unsaturated compounds having an acid group may be obtained by subjecting some hydroxyl groups of the polyfunctional alcohol to (meth)acrylation, and adding an acid anhydride to the remaining hydroxyl groups. Examples of the commercially available product include polybasic acid modified-acrylic oligomers manufactured by TOAGOSEI CO., LTD., such as M-510 and M-520.

A polyfunctional thiol compound having two or more mercapto (SH) groups in the same molecule is also suitable as the polymerizable compound. Specifically, the compound represented by the following Formula (I) is preferred.

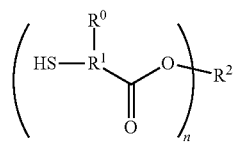

In the formula, $R^1$ represents an alkyl group, $R^2$ represents an n-valent aliphatic group which may contain any atoms other than carbons, $R^0$ is not H, but an alkyl group, and n represents 2 to 4.

Particular examples of the polyfunctional thiol compound include 1,4-bis(3-mercaptobutyloxy)butane [Formula (II)], 1,3,5-tris(3-mercaptobutyloxyethyl)-1,3,5-triazine-2,4,6 (1H,3H,5H)-trione [Formula (III)] and pentaerythritol tetrakis(3-mercaptobutyrate) [Formula (IV)]. These polyfunctional thiol may be used either alone or in combination of two or more thereof.

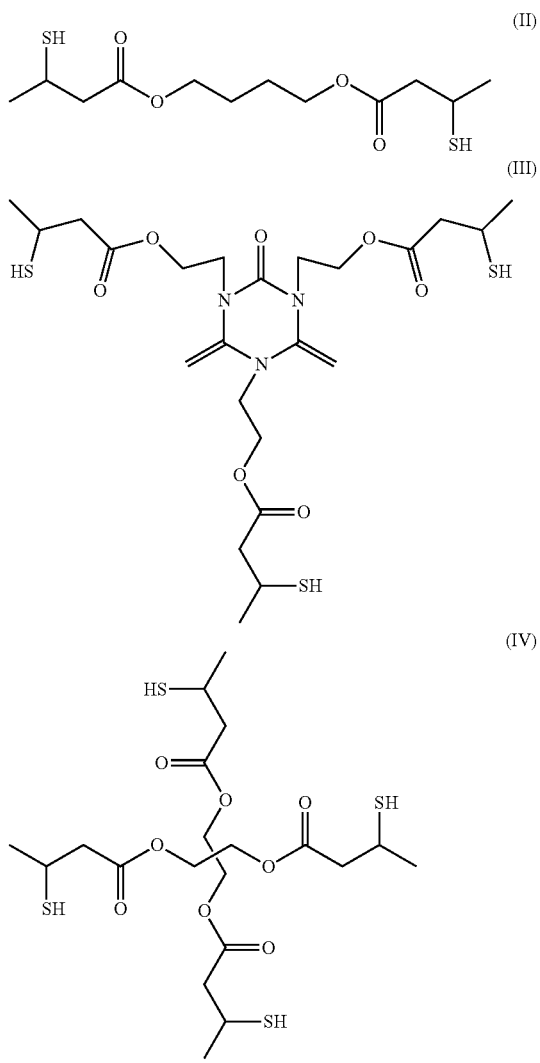

The amount of the polyfunctional thiol blended in the curable composition is preferably 0.3% by weight to 8.9% by weight, and more preferably 0.8% by weight to 6.4% by weight, based on the total solids except the solvent. Addition of the polyfunctional thiol can improve the stability, malodor, sensitivity, resolution, development, adhesion and the like of the curable composition.

For these polymerizable compounds, details of the methods of use thereof, such as the structure of the compounds, single use or use of a combination and the amount to be added, may be arbitrarily determined in accordance with the final performance design of the coloring composition. For example, from the viewpoint of sensitivity, a structure having a high content of unsaturated groups per one molecule is preferred, and in many cases, bifunctional or higher functionality is preferred. Further, from the viewpoint of increasing the strength of the colored cured film, a trifunctional or higher functionality is suitable. In addition, a method of controlling both the sensitivity and the strength by using in combination compounds which are different in functional number and different in polymerizable group (for example, an acrylic acid ester, a methacrylic acid ester, a styrene-based compound and a vinyl ether-based compound), is also effective. Furthermore, it is preferred to use in combination tri- or higher functional polymerizable compounds which are different in ethylene oxide chain length in that it is possible to control the developing property of the coloring curable composition, and obtain an excellent pattern forming performance. Further, the selection and the method of use of the polymerizable compounds are also important factors for compatibility with other components (for example, a photopolymerization initiator, a colorant (pigment), a binder polymer and the like) contained in the coloring composition and for dispersibility, and for example, the compatibility may be increased by the use of a compound with low purity, or by the combination use of two or more of other components in some cases. In addition, in some cases, a specific structure may be selected from the viewpoint of improving the adhesion to a hard surface such as a support.

The content of the polymerizable compound in the curable composition of the present invention is preferably 0.1% by mass to 90% by mass, more preferably 1.0% by mass to 80% by mass, and particularly preferably 2.0% by mass to 70% by mass, based on the solid content in the curable composition.

The mass ratio of the specific colorant and the polymerizable monomer contained in the curable composition of the present invention (the compound represented by Formula (1): the polymerizable monomer) is preferably 1:2 to 20:1, and more preferably 1:1 to 10:1 from the viewpoint of the layer thinning.

—Radical Polymerization Initiator—

It is preferred that the curable composition of the present invention further contains a radical polymerization initiator from the viewpoint of further enhancing the sensitivity.

Since the radical photopolymerization initiator can impart photosensitivity to the polymerizable composition to provide a photosensitive composition, and may be suitably used for a color resistor and the like, it is preferred to contain the radical photopolymerization initiator. As the radical photopolymerization initiator, a polymerization initiator known as the polymerization initiators as described below may be used.

The photopolymerization initiator is not particularly limited so long as the photopolymerization initiator has an ability to initiate polymerization of the polymerizable compound, and may be suitably selected from known photopolymerization initiators. For example, a photopolymerization initiator having photosensitivity to visible light in the ultraviolet ray region is preferred. In addition, the photopolymerization initiator may be an activator which causes any action with a photo-excited sensitizer to produce an active radical and may be an initiator which initiates the cationic polymerization depending on the kind of the monomer.

Furthermore, it is preferred that the photopolymerization initiator contains at least one compound having a molecular absorption coefficient of at least about 50 within the range of about 300 nm to 800 nm (more preferably from 330 nm to 500 nm).

Examples of the photopolymerization initiator include a halogenated hydrocarbon derivative (for example, a compound having a triazine structure), a compound having an oxadiazole structure and the like), an acylphosphine compound such as acylphosphine oxide, hexaarylbiimidazole, an oxime compound such as oxime derivative, an organic peroxide, a thio compound, a ketone compound, an aromatic onium salt, a ketoxime ether, an aminoacetophenone compound, hydroxyacetophenone and the like.

Examples of the halogenated hydrocarbon compound having a triazine structure include the compounds as described in Wakabayashi et al., Bull. Chem. Soc. Japan, 42, 2924 (1969), the compounds as described in GB Patent No. 1388492, the compounds as described in Japanese Patent Application Laid-Open No. S53-133428, the compounds as described in German Patent No. 3337024, the compounds as described in F. C. Schaefer et al., J. Org. Chem.; 29, 1527 (1964), the compounds as described in Japanese Patent Application Laid-Open No. S62-58241, the compounds as described in Japanese Patent Application Laid-Open No. H5-281728, the compounds as described in Japanese Patent Application Laid-Open No. H5-34920, the compounds as described in U.S. Pat. No. 4,212,976 and the like.

Examples of the compounds as described in U.S. Pat. No. 4,212,976 include a compound having an oxadiazole structure (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-2-tribromomethyl-5-styryl-1,3,4-oxadiazole and the like) and the like.

Further, examples of the photopolymerization initiator other than the polymerization initiators described above include an acridine derivative (for example, 9-phenylacridine, 1,7-bis(9,9'-acridinyl)heptane and the like), N-phenylglycine and the like, a polyhalogen compound (for example, carbon tetrabromide, phenyl tribromomethyl sulfone, phenyl trichloromethyl ketone and the like), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds as described in Japanese Patent Application Laid-Open Nos. H5-19475, H7-271028, 2002-363206, 2002-363207, 2002-363208 and 2002-363209, and the like), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, LucirinTPO and the like), metallocenes (for example, bis(η5-2,4-cyclopentadien-1-yl)-bis(2,6-difluoro-3-(1H-pyrrol-1-yl)-phenyl)titanium, η5-cyclopentadienyl-η6-cumenyl-iron(1+)-hexafluorophosphate (1−) and the like), the compounds as described in Japanese Patent Application Laid-Open No. S53-133428, Japanese Patent Publication Nos. S57-1819 and S57-6096 and U.S. Pat. No. 3,615,455, and the like.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, 4,4'-bis(dialkylamino)benzophenones (for example, 4,4'-bis(dimethylamino)benzophenone, 4,4'-bisdicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-t- butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(m ethylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, N-butyl-chloroacridone and the like.

As the photopolymerization initiator, a hydroxyacetophenone compound, an aminoacetophenone compound and an acylphosphine compound may also be suitably used. More specifically, for example, an aminoacetophenone-based initiator as described in Japanese Patent Application Laid-Open No. H10-291969 and an acylphosphine oxide-based initiator as described in Japanese Patent No. 4225898 may also be used.

As the hydroxyacetophenone-based initiator, IRGACURE-184, DAROCUR-1173, IRGACURE-500, IRGACURE-2959 and IRGACURE-127 (trade names: all manufactured by BASF Corp.) may be used. As the aminoacetophenone-based initiator, commercially available products IRGACURE-907, IRGACURE-369 and IRGACURE-379 (trade names: all manufactured by BASF Corp.) may be used. As the aminoacetophenone-based initiator, the compounds as described in Japanese Patent Application Laid-Open No. 2009-191179, where the absorption wavelength matches the light source having a long wavelength such as 365 nm or 405 nm, may also be used. In addition, as the acylphosphine-based initiator, commercially available products IRGACURE-819 or DAROCUR-TPO (trade names: all manufactured by BASF Corp.) may be used.

The photopolymerization initiator more preferably includes an oxime-based compound. As specific examples of the oxime-based initiator, the compounds as described in Japanese Patent Application Laid-Open No. 2001-233842, the compounds as describe in Japanese Patent Application Laid-Open No. 2000-80068 and the compounds as described in Japanese Patent Application Laid-Open No. 2006-342166 may be used.

Examples of the oxime compound such as oxime derivative, which is suitably used as the photopolymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one and the like.

Examples of the oxime compounds include the compounds as described in J. C. S. Perkin II (1979) pp. 1653-1660, J. C. S. Perkin II (1979) pp. 156-162, Journal of Photopolymer Science and Technology (1995) pp 202-232, Japanese Patent Application Laid-Open Nos. 2000-66385 and 2000-80068, Japanese Patent Application Laid-Open No. 2004-534797, Japanese Patent Application Laid-Open No. 2006-342166, and the like.

As the commercially available product, IRGACURE-OXE01 (manufactured by BASF Corp.) and IRGACURE-OXE02 (manufactured by BASF Corp.) may also be suitably used.

In addition, as the oxime compound other than oxime compounds described above, the compounds as described in Japanese Patent Application Laid-Open No. 2009-519904, where oxime is linked to the N-position of carbazole, the compounds as described in U.S. Pat. No. 7,626,957, where a hetero-substituent is introduced into the benzophenone moiety, the compounds as described in Japanese Patent Application Laid-Open No. 2010-15025 and U.S. Patent Application Publication No. 2009-292039, where a nitro group is introduced into the dye moiety, the ketoxime-based compounds as described in International Publication No. 2009-131189, the compounds as described in U.S. Pat. No. 7,556,910, containing a triazine structure and an oxime structure within the same molecule, the compounds as described in Japanese Patent Application Laid-Open No. 2009-221114, having an absorption maximum at 405 nm and exhibiting good sensitivity for a g-ray light source, and the like may also be used.

Preferably, furthermore, cyclic oxime compounds as described in Japanese Patent Application Laid-Open No. 2007-231000 and Japanese Patent Application Laid-Open No. 2007-322744 may also be suitably used. Among cyclic oxime compounds, the cyclic oxime compounds condensed to a carbazole dye, as described in Japanese Patent Application. Laid-Open No. 2010-32985 and Japanese Patent Application Laid-Open No. 2010-185072, have high light absorptivity and thus are particularly preferred from the viewpoint of high sensitivity.

Further, in the compounds as described in Japanese Patent Application Laid-Open No. 2009-242469, having an unsaturated bond at a specific site of an oxime compound, high sensitivity may also be achieved by regenerating an active radical from a polymerization inactive radical, and thus the compounds may be suitably used.

Most preferred is the oxime compound having a specific substituent as described in Japanese Patent Application Laid-Open No. 2007-269779 or the oxime compound having a thioaryl group as described in Japanese Patent Application Laid-Open No. 2009-191061.

Specifically, the oxime-based polymerization initiator compound is preferably a compound represented by the following formula (i). In addition, the N-0 bond of the oxime bond may be an oxime compound of (E) form, an oxime compound of (Z) form, or a mixture of (E) form and (Z) form.

(1)

In Formula (1), each of R and B independently represents a monovalent substituent, A represents a divalent organic group, and Ar represents an aryl group.

The monovalent substituent represented by R is preferably a monovalent nonmetallic atom group. Examples of the monovalent nonmetallic atom group include an alkyl group, an aryl group, an acyl group, an alkoxycarbonyl group, an aryloxycarbonyl group, a heterocyclic group, an alkylthiocarbonyl group, an arylthiocarbonyl group and the like. Further, these groups may have one or more substituents. In addition, the above-described substituent may be substituted with another substituent.

Examples of the substituent include a halogen atom, an aryloxy group, an alkoxycarbonyl group, or an aryloxycarbonyl group, an acyloxy group, an acyl group, an alkyl group, an aryl group and the like.

As the alkyl group which may have a substituent, an alkyl group having 1 to 30 carbon atoms is preferred, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group and a 3-nitrophenacyl group.

As the aryl group which may have a substituent, an aryl group having 6 to 30 carbon atoms is preferred, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quater phenyl group, an o-tolyl group, a m-tolyl group, p-tolyl group, a xylyl group, an o-cumenyl group, a m-cumenyl group, a p-cumenyl group, a mesityl group, a pentalenyl group, a binaphthalenyl group, a ternaphthalenyl group, a quarter naththalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quarter anthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group and an ovalenyl group.

As the acyl group which may have a substituent, an acyl group having 2 to 20 carbon atoms is preferred, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group and a 4-methoxybenzoyl group.

As the alkoxycarbonyl group which may have a substituent, an alkoxycarbonyl group having 2 to 20 carbon atoms is preferred, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group and a 4-methoxyphenyloxycarbonyl group.

As the heterocyclic group which may have a substituent, an aromatic or aliphatic heterocycle including a nitrogen atom, an oxygen atom, a sulfur atom or a phosphorus atom is preferred.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group and a thioxantholyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group and a trifluoromethyl thiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group and a 4-methoxyphenylthiocarbonyl group.

The monovalent substituent represented by B represents an aryl group, a heterocyclic group, an arylcarbonyl group or a heterocyclic carbonyl group. In addition, these groups may have one or more substituents. As the substituent, the above-described substituents may be exemplified. Further, the above-described substituent may be substituted with another substituent.

Among them, structures shown below are particularly preferred.

In the structures, Y, X and n have the same meanings as Y, X and n in Formula (2) as described below, and preferred examples thereof are also the same.

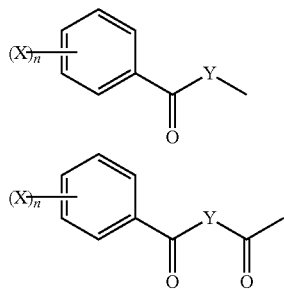

Examples of the divalent organic group represented by A include an alkylene group having 1 to 12 carbon atoms, a cycloalkylene group and an alkynylene group. Further, these groups may have one or more substituents. As the substituent, the above-described substituents may be exemplified. In addition, the above-described substituent may be substituted with another substituent.

Among them, from the viewpoint of increasing the sensitivity to suppress the coloration as the heating time passes, A is preferably an unsubstituted alkylene group, an alkylene group substituted with an alkyl group (for example, a methyl group, an ethyl group, a tert-butyl group and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group and a styryl group).

The aryl group represented by Ar is preferably an aryl group having 6 to 30 carbon atoms, and may have a substituent. As the substituent, the substituents introduced into the substituted aryl group exemplified above as a specific example of the aryl group which may have a substituent may be exemplified.

Among them, from the viewpoint of increasing the sensitivity to suppress the coloration as the heating time passes, a substituted or unsubstituted phenyl group is preferred.

In Formula (1), from the viewpoint of the sensitivity, the structure of "SAr" formed by Ar in Formula (1) and S adjacent thereto is preferably the structure shown below. Further, Me represents a methyl group, and Et represents an ethyl group.

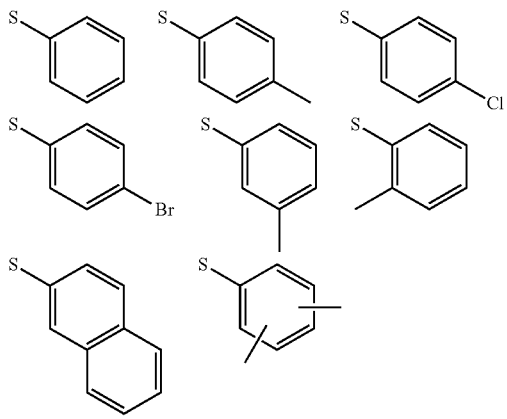

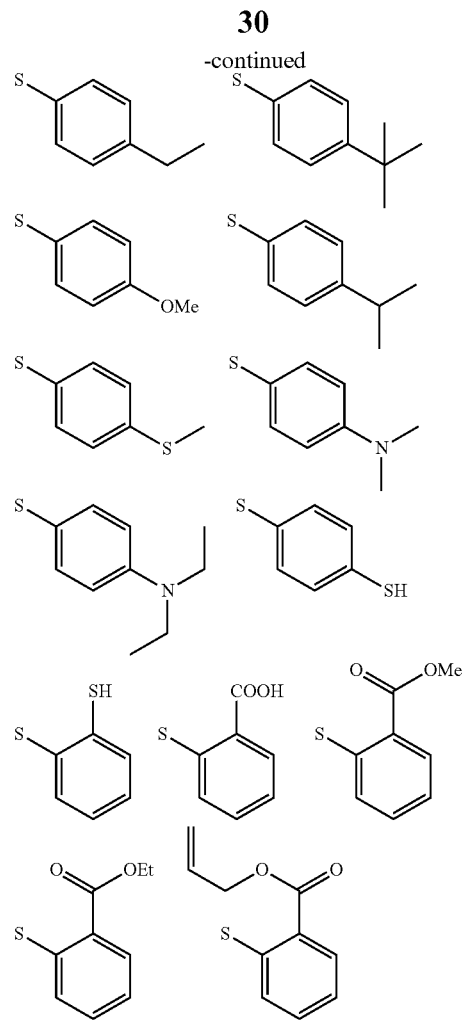

The oxime compound is preferably a compound represented by the following Formula (2).

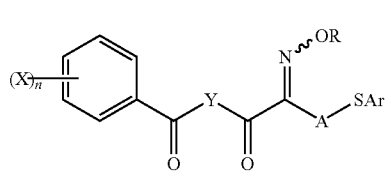

(In Formula (2), each of R and X independently represents a monovalent substituent, each of A and Y independently represents a divalent organic group, Ar represents an aryl group, and n is an integer of 0 to 5.)

In Formula (2), R, A and Ar have the same meanings as R, A and Ar in Formula (1), and preferred examples thereof are also the same.

Examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. Further, these groups may have one or more substituents. As the substituent, the above-described substituents may be exemplified. Further, the above-described substituent may be substituted with another substituent.

Among them, from the viewpoint of solvent solubility and enhancement of absorption efficiency in the long wavelength region, X in Formula is preferably an alkyl group.

In addition, In Formula (2), n represents an integer of 0 to 5, and preferably an integer of 0 to 2.

Examples of the divalent organic group represented by Y include structures shown below. Meanwhile, in the groups shown below, "*" represents a bonding position to the carbon atom adjacent to Y in Formula (2).

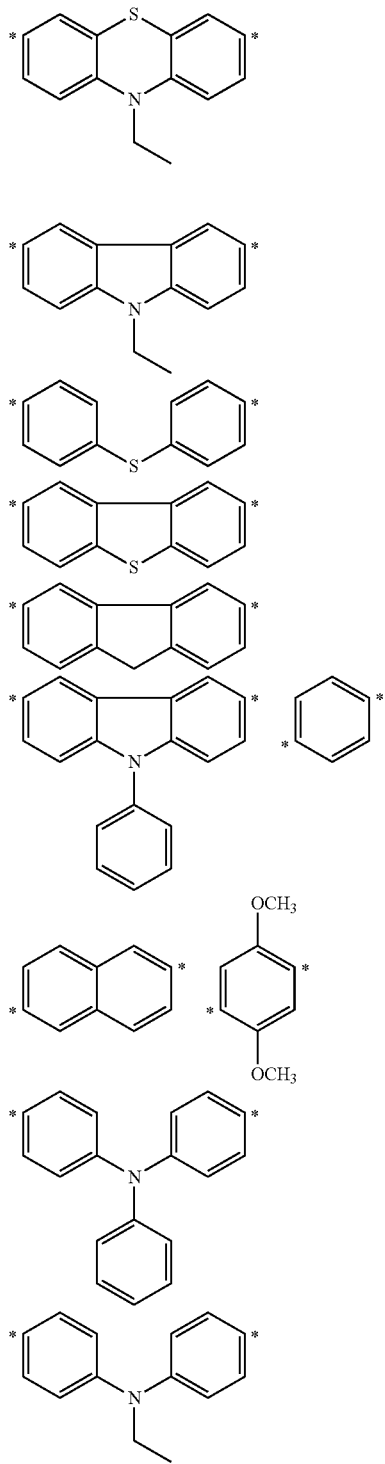

Among them, from the viewpoint of high sensitivity, structures shown below are preferred.

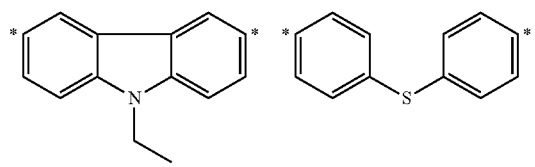

Further, the oxime compound is preferably a compound represented by the following formula (3).

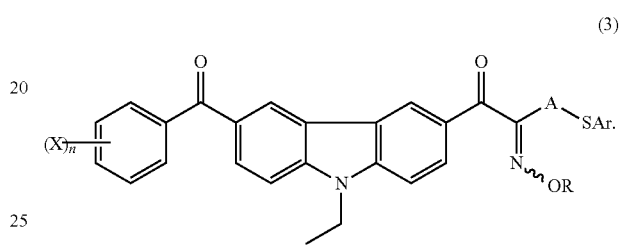

(3)

In Formula (3), each of R and X independently represents a monovalent substituent, A represents a divalent organic group, Ar represents an aryl group, and n is an integer of from 0 to 5.

In Formula (3), R, X, A, Ar and n have the same meanings as R, X, A, Ar and n in Formula (2), and preferred examples thereof are also the same.

Hereinafter, specific examples (C-4) to (C-13) of oxime compounds which are suitably used will be shown, but the present invention is not limited thereto.

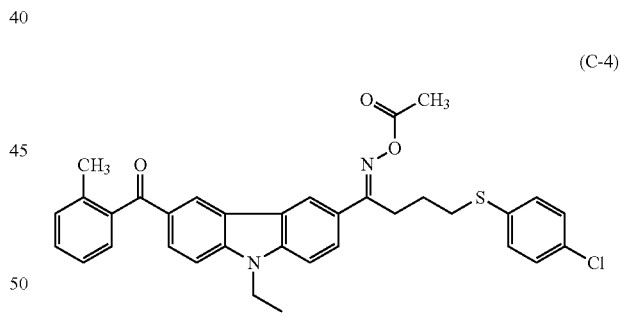

(C-4)

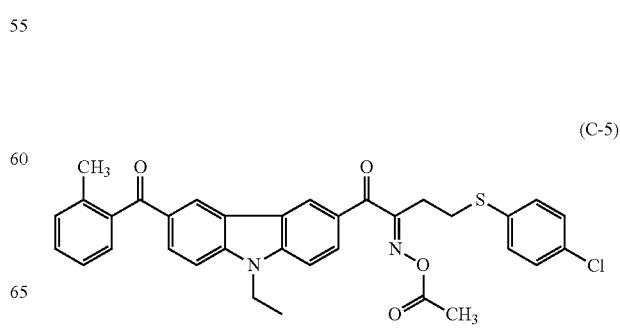

(C-5)

-continued (C-6) 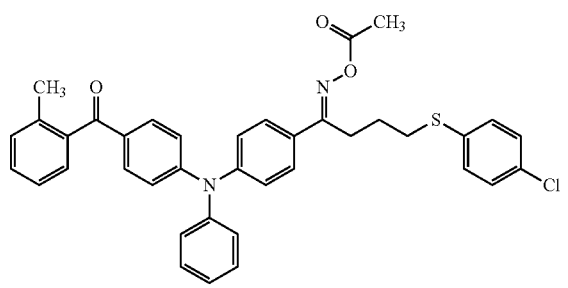

(C-7) 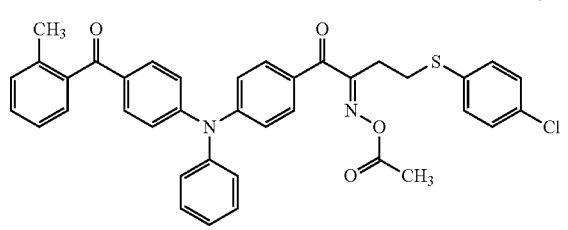

(C-8) 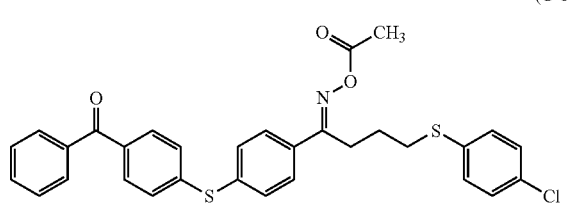

(C-9) 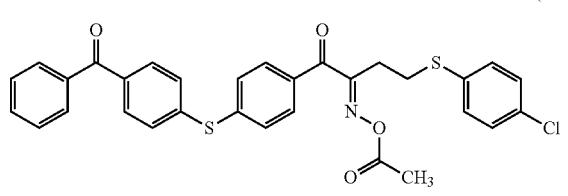

(C-10) 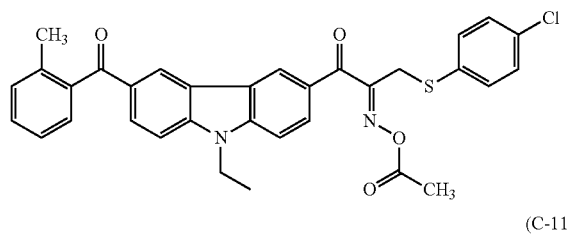

(C-11) 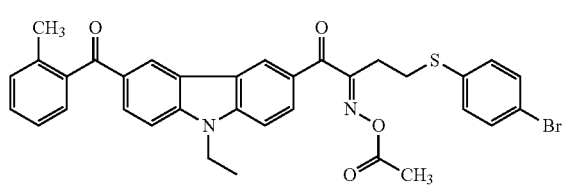

(C-12) 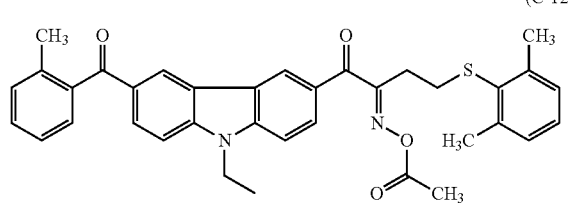

-continued (C-13) 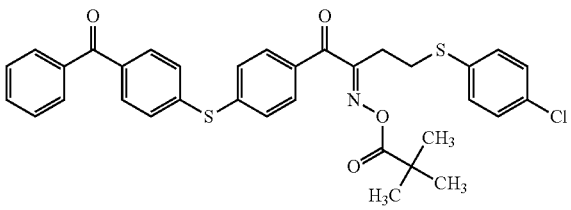

The oxime compound has a maximum absorption wavelength in the wavelength region of 350 nm to 500 nm, preferably an absorption wavelength in the wavelength region of 360 nm to 480 nm and particularly preferably a high absorbance of 365 nm to 405 nm.

The oxime compound has a molar absorption coefficient of preferably 1,000 to 300,000, more preferably 2,000 to 300,000, and particularly preferably 5,000 to 200,000 in 365 nm or 405 nm, from the viewpoint of sensitivity.

The molar absorption coefficient of the compound may be measured by using a known method, but specifically, it is preferred that the coefficient is measured, for example, by an ultraviolet and visible spectrophotometer (Carry-5 spectrophotometer, manufactured by Varian Inc.) at a concentration of 0.01 g/L using an ethyl acetate solvent.

As the polymerization initiator used in the present invention, two or more thereof may be used in combination, if necessary.

The content (the total content in the case of two or more kinds) of the photoradical polymerization initiator in the curable composition is preferably in the range of 0.1% by mass to 20% by mass, more preferably 0.5% by mass to 10% by mass, and particularly preferably 1% by mass to 8% by mass, based on the total solids of the curable composition. Within this range, good sensitivity and pattern formability may be obtained.

For the purpose of enhancing the radical generation efficiency of the radical initiator and lengthening the photosensitive wavelength, the polymerizable composition may contain a sensitizer. The sensitizer which can be used in the present invention preferably sensitizes for (C) the photoradical polymerization initiator by electron migration mechanism or energy migration mechanism.

Examples of the sensitizer used in the present invention include the compounds as described in paragraph Nos. [0101] to [0154] of Japanese Patent Application Laid-Open No. 2008-32803.

The content of the sensitizer in the curable composition is preferably 0.1% by mass to 20% by mass, and 0.5% by mass and 15% by mass in terms of solids from the viewpoint of light absorption efficiency to the core and initiation-decomposition efficiency.

The sensitizer may be used either alone or in combination of two or more thereof.

~Organic Solvent~

The curable composition of the present invention may be generally composed by using an organic solvent. The organic solvent is not basically particularly limited so long as the solubility of each component or the coatability of the curable composition is satisfied. In particular, the organic solvent is preferably selected in consideration of the solubility of the binder, the coatability and the safety. In addition, when preparing the curable composition of the present invention, it is preferred to contain at least two organic solvents.

Examples of the organic solvent suitably include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example: methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate and the like)), 3-oxypropionic acid alkyl esters (for example: methyl 3-oxypropionate, ethyl 3-oxypropionate and the like (for example, methyl 3-methoxypropionate, ethyl 3-methoxypropionate, methyl 3-ethoxypropionate, ethyl 3-ethoxypropionate and the like)), 2-oxypropionic acid alkyl esters (for example: methyl 2-oxypropionate, ethyl 2-oxypropionate, propyl 2-oxypropionate and the like (for example, methyl 2-methoxypropionate, ethyl 2-methoxypropionate, propyl 2-methoxypropionate, methyl 2-ethoxypropionate and ethyl 2-ethoxypropionate)), methyl 2-oxy-2-methylpropionate and ethyl 2-oxy-2-methylpropionate (for example, methyl 2-methoxy-2-methylpropionate, ethyl 2-ethoxy-2-methylpropionate and the like), methyl pyruvate, ethyl pyruvate, propyl pyruvate, methyl acetoacetate, ethyl acetoacetate, methyl 2-oxobutanoate, ethyl 2-oxobutanoate and the like, ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate and the like, ketones, for example, methyl ethyl ketone, cyclohexanone, 2-heptanone, 3-heptanone and the like, and aromatic hydrocarbons, for example, toluene, xylene and the like.

For these organic solvents, a form of mixing two or more thereof is also preferred from the viewpoint of the solubility of the monomer or resin, the improvement of the coated surface shape and the like. In this case, particularly preferred is a mixed solution composed of two or more selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate, as described above.

From the viewpoint of coatability, the content of the organic solvent in the coloring curable composition is preferably set such that the total solids concentration of the composition becomes 5% by mass to 80% by mass, more preferably 5% by mass to 60% by mass, and particularly preferably 10% by mass to 50% by mass.

~Other Additives~

Various additives may be added to the non-photosensitive curable composition of the present invention as necessary. Specific examples of the various additives include the various additives as described in Japanese Patent Application Laid-Open No. 2005-326453.

[Color Filter for Solid-State Imaging Devices and Method for Manufacturing the Same]

The method for manufacturing a color filter of the present invention may be applied to a method for manufacturing a color filter for solid-state imaging devices.

The method for manufacturing a color filter for solid-state imaging devices of the present invention to which the method for manufacturing a color filter is applied may include coating the colorant containing curable composition as described above onto a support to form a coloring curable composition layer (hereinafter, also referred to as "coloring curable composition layer forming step"); exposing the coloring curable composition layer through a mask (hereinafter, also referred to as "exposure step"); and developing the exposed coloring curable composition layer to form a colored pattern (hereinafter, also referred to as "development step").

In addition, the color filter for solid-state imaging devices of the present invention is manufactured according to the method for manufacturing a color filter for solid-state imaging devices.

As a specific aspect of the color filter for solid-state imaging devices of the present invention, for example, an aspect of a color filter for multicolors in combination of the red pattern and other colored pattern (for example, a color filter of three or more colors at least having the red pattern, the blue pattern and the green pattern) is suitable.

Hereinafter, the color filter for solid-state imaging devices will be simply referred to as "color filter".

<Colored Curable Composition Layer Forming Step>

In the colored curable composition layer forming step, the colorant containing curable composition is coated onto a support to form a coloring curable composition layer.

Examples of the support which can be used in this step include a substrate for solid-state imaging devices in which an imaging device (photodetector) such as a charge coupled device (CCD) or a complementary metal oxide semiconductor (CMOS) is provided on a substrate (for example, a silicon substrate).

The colored pattern in the present invention may be formed on the imaging device forming side (front side) or the imaging device non-forming side (rear side) of the substrate for solid-state imaging devices.

A light-shielding film may be provided between each imaging device on the substrate for solid-state imaging devices, or on the rear side of the substrate for solid-state imaging devices.

A primer layer may be provided on the support for the purpose of improving adhesion to an upper layer, preventing diffusion of substances or flattening the surface of the substrate as necessary.

As a method for coating the colorant containing curable composition onto the support, various coating methods such as slit coating, an inkjet method, rotary coating, cast coating, roll coating and a screen printing method can be applied.

The thickness of the coloring curable composition layer is preferably 0.1 µm to 10 more preferably 0.2 µm to 5 µm, and still more preferably 0.2 µm to 3 µm.

Drying (pre-baking) of the coloring curable composition layer coated on the support can be carried out at a temperature of 50° C. to 140° C. for 10 seconds to 300 seconds by using a hot plate, an oven and the like.

<Exposure Step>

In the exposure step, the coloring curable composition layer formed in the coloring curable composition layer forming step is pattern exposed through a mask having a predetermined mask pattern using an exposure apparatus such as a stepper.

As radiations (light) which can be used for the exposure, in particular, ultraviolet rays such as g-rays and i-rays (particularly i-rays) can be preferably used. The irradiation dose (exposure amount) is preferably 30 mJ/cm$^2$ to 1,500 mJ/cm$^2$, more preferably 50 mJ/cm$^2$ to 1,000 mJ/cm$^2$, and most preferably from 80 mJ/cm$^2$ to 500 mJ/cm$^2$.

<Development Step>

Subsequently, by carrying out an alkaline development treatment, an unexposed portion of the colored curable composition layer in the exposure step is eluted into an alkaline aqueous solution, and only a photo-cured portion remains.

As the developing solution, an organic alkaline developing solution which does not damage an imaging device or a circuit of the substrate is preferred. The development temperature is usually 20° C. to 30° C., and the development time is 20 seconds to 90 seconds. In order to further remove residues, recently, the development is carried out for 120 seconds to 180 seconds in some cases. In addition, in order to further enhance the residue removal property, the developing solution is sprinkled every 60 seconds to provide a fresh developing solution, and this step is repeated several times in some cases.

Examples of an alkaline agent which is used as the developing solution include ammonia water and organic alkaline compounds such as ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene. An alkaline aqueous solution prepared by diluting such an alkaline agent with pure water so as to have a concentration of 0.001% by mass to 10% by mass, and preferably from 0.01 by mass to 1% by mass is preferably used as the developing solution.

In addition, as the developing solution, an inorganic alkaline compound may be used. Examples of the inorganic alkaline compound preferably include sodium hydroxide, potassium hydroxide, sodium carbonate, sodium hydrogencarbonate, sodium silicate and sodium metasilicate.

In addition, when a developing solution composed of such an alkaline aqueous solution is used, the developing solution is generally rinced with pure water after development.

Next, after drying, a heat treatment (post-baking) is preferably carried out. When forming a multicolored pattern, the above-described step is successively repeated for every color to obtain a cured film. A color filter can be obtained in this way.

The post-baking is a heat treatment after the development for the purpose of making the curing complete. The heat curing treatment is usually carried out at 100° C. to 240° C., and preferably 200° C. to 240° C.

This post-baking treatment can be carried out continuously or batchwise on the coating film after the development by using a heating means such as a hot plate, a convection oven (hot air circulating oven) and a high-frequency heater under the above-described condition.

Besides the above-described steps, the method for manufacturing a color filter for solid-state image devices of the present invention may include any known steps in a method for manufacturing a color filter for solid-state imaging devices, if necessary. For example, after the curable composition layer forming step, exposure step and development step as describe above, the method of the present invention may include a curing step of curing the formed colored pattern by heating and/or exposure, if necessary.

In addition, when using a coloring curable composition related to the present invention, there may be occurred, for example, clogging of a nozzle or piping of a discharging unit in a coater, or contamination by adhesion, sedimentation or drying of the coloring curable composition or pigments into the coater. Accordingly, in order to efficiently clean the contamination caused by the coloring curable composition of the present invention, the solvent as described above with respect to the present invention may be preferably used as a cleaning liquid. Further, the cleaning liquids as described in Japanese Patent Application Laid-Open Nos. H7-128867, H7-146562, H8-278637, 2000-273370, 2006-85140, 2006-291191, 2007-2101, 2007-2102, 2007-281523 and the like may be suitably used for washing out the coloring curable composition related to the present invention.

Among them, alkylene glycol monoalkyl ether carboxylate and alkylene glycol monoalkyl ether are preferred.

These solvents may be used either alone or in mixture of two or more thereof. When a mixture of two or more is used, a mixture of a solvent having hydroxyl groups and a solvent having no hydroxyl groups is preferred. The mass ratio of the solvent having hydroxyl groups and the solvent having no hydroxyl groups is 1/99 to 99/1, preferably 10/90 to 90/10, amd more preferably 20/80 to 80/20. A mixed solvent of propylene glycol monomethyl ether acetate (PGMEA) and propylene glycol monomethyl ether (PGME) in a ratio of 60/40 is particularly preferred. Further, in order to enhance the permeability of the cleaning liquid to contaminants, a surfactant as described above with respect to the present invention may be added to the cleaning liquid.

Since the color filter for solid-state imaging devices of the present invention is manufactured by the method for manufacturing a color filter for solid-state imaging devices to which the method for manufacturing a color filter of the present is applied, the color filter has high dimensional accuracy of the pixel pattern and small substrate damage.

The color filter for solid-state imaging devices of the present invention may be suitably used for a solid-state imaging device such as a CCD and a CMOS, and is particularly appropriate for a CCD or a CMOS with a high resolution over one million pixels. The color filter for solid-state imaging devices of the present invention may be used as a color filter disposed between a light-receiving unit of each pixel composing CCD and CMOS and a microlens for concentrating light.

The film thickness of the colored pattern (colored pixel) in the color filter for solid-state imaging devices is preferably 2.0 µm or less, and more preferably 1.0 µm or less.

In addition, the size (pattern width) of the colored pattern (colored pixel) is preferably 2.5 µm or less, more preferably 2.0 µm or less, and particularly preferably 1.7 µm or less.

[Solid-State Imaging Device]

The solid-state imaging device of the invention is provided with the color filter for solid-state imaging devices of the invention as described above. The constitution of the solid-state imaging device of the invention is not particularly limited so long as it is a constitution provided with the color filter for solid-state imaging devices of the present invention and a constitution for functioning as a solid-state imaging device. Examples thereof include the following constitution.

There is an exemplary constitution including a plurality of photodiodes and a transfer electrode made of polysilicon and the like composing a light-receiving area of the solid-state imaging device (such as a CCD image sensor and a CMOS image sensor) provided on a support, a light-shielding film made of tungsten and the like having an opening only to the light-receiving unit of the photodiodes provided on the above-described photodiodes and the above-described transfer electrode, a device protective film made of silicon nitride and the like formed so as to cover the whole light-shielding film and the photodiode light-receiving unit provided on the light-shielding film, and the color filter for solid-state imaging devices of the present invention provided on the above-described device protective film.

In addition, the constitution may have a light concentrating unit (such as a microlens, same as above) on the above-mentioned device protective layer and below the color filter (on the side near to the support), or the constitution may have a light concentrating unit on the color filter.

EXAMPLES

Hereinafter, the present invention will be specifically described with reference to Examples, but the present invention is not limited to the Examples, without deviating from the main intent. Meanwhile, unless particularly specified, "parts" and "%" are based on mass. Meanwhile, when a commercially available treatment liquid is used to perform a treatment in each step, each treatment is performed by a method designated by a maker unless otherwise specified.

Example 1

Preparation of Curable Composition

<Composition of Heat Curable Composition GREEN>

Pigment dispersion liquid 52.9 g

A mixed solution having the following composition was mixed and dispersed with a bead mill (a vacuum mechanism-equipped high-pressure disperser, NANO-3000-10 (manufactured by Nihon B.E.E. Co., Ltd.)), using zirconium oxide beads having a diameter of 0.3 mm to prepare a pigment dispersion liquid.

GREEN pigment (PG 36/PG 7/PY 139=80/20/30 (mass ratio))/dispersant/dispersion resin [BYK-2001 manufactured by BYK Chemie/benzyl methacrylate/methacrylic acid copolymer (molar ratio: 70/30, Mw: 30,000)] ratio (mass ratio) of dispersant/dispersion resin=4/21

Solid content: 25.5% by mass, mass of pigments: 15.3% by mass

Heat curable resin 1.2 g (Lactone-modified epoxy resin, EHPE-3150, manufactured by Daicel Chemical Industries, Ltd.)

| | |
|---|---|
| Methyl phthalic anhydride | 0.3 g |
| Surfactant | 0.003 g |
| (Fluorine-based surfactant, F-781, manufactured by DIC Corporation) | |
| Propylene glycol monomethyl ether acetate (PGMEA, solvent added) | 45.6 g |

—First Step—

The heat curable composition GREEN obtained above was coated on a Si substrate. The Si substrate is presumed to function as a support for a CMOS sensor. The heat curable composition GREEN was coated so as to have a thickness of 0.50 μm after drying and post-baking, dried and post-baked at 220° C. for 5 minutes to form a GREEN film layer.

—Second Step—

Subsequently, a positive-type photoresist (Fhi622BC, manufactured by FUJIFILM Electronic Materials Co., Ltd.) was coated by a spin coater, and subjected to a pre-baking treatment at 90° C. for 1 minute to form a photoresist layer having a film thickness of 0.8 μm. The photoresist layer was arranged in a checkered pattern so as to obtain a 1.0 μm-square Bayer arrangement.

Next, the formed photoresist layer was pattern-exposed with an exposure dose of 300 mJ/cm$^2$ by using an i-ray stepper (FPA3000i5, manufactured by Canon Inc.) and was subjected to heat treatment (PEB treatment) at the temperature of the photoresist layer or the atmosphere of 110° C. for 1 minute. Thereafter, a puddle development was carried out with a developing solution FHD-5 (tetramethyl ammonium hydroxide (TMAH): 2.38% by mass, manufactured by FUJIFILM Electronic Materials Co., Ltd.) for 1 min, followed by rinsing with pure water. Further, a post-baking treatment was carried out at 110° C. for 1 minute to form a photoresist mask. The resist mask is formed in a checkered pattern so as to have a resist pattern width (a length of one side of a square pattern) of 1.03 μM.

—Third Step—

A dry etching treatment was carried out under the following conditions to process the GREEN film layer to form a BAYER pattern.

<Etching Conditions>

First Etching Conditions

Etching apparatus: U-621 (manufactured by Hitachi High-Technologies Corporation)

Gas flow rate: Ar/CF$_4$/O$_2$=800/200/50 ml/min

Bias: RF power: 800 W,
  Antenna bias: 100 W and
  Wafer bias: 600 W

Electrode height: 68 mm

Pressure: 2.0 Pa

Here, the pressure refers to an internal pressure of the chamber. Hereinafter, the pressure is the same as above.

Etching time: 60 seconds (amount of GREEN film layer etched: 0.450 μm)

Second Etching Conditions

Gas flow rate: Ar/N$_2$/CF$_4$/O$_2$=500/500/5/25 ml/min (ratio of halogen compound gas: 0.48%)

Bias: RF power: 800 W,
  Antenna bias: 100 W and
  Wafer bias: 600 W

Electrode height: 68 mm

Pressure: 4.0 Pa

Etching time: 15 seconds (etching amount of GREEN film layer of 0.050 μm+overetching rate of 10%)

—Fourth Step—

A stripping treatment was carried out under the following conditions by using the photoresist layer as an etching mask.

<Stripping Conditions>

Substrate temperature: 50° C.

Stripping solution: MS230C (manufactured by FUJIFILM Electronic Materials Co., Ltd.)

Stripping time: 120 seconds (puddle treatment)

Rinse: 60 seconds with pure water, spraying with a spray nozzle (0.2 Pa)

Spin drying: 2,000 rpm, 30 seconds

Subsequently, a dehydration treatment was carried out at 120° C. for 2 minutes by using a hot plate, and the formation of the first pattern was completed. As a result, a checkered pattern (first organic pattern) was formed by the heat curable composition GREEN. The pattern size (a length of one side of the checkered pattern) of the colored layer was 0.99 μm. In addition, after stripping the photoresist, roughness of the pattern, notch caused by etching and the like were not observed, and thus, the shape was good. The Si substrate damage (shaving amount) of the lower layer was 0.010 μm.

Conditions of each etching process in Example 1, and evaluation results after stripping a photoresist are shown in Table 1 below along with other Examples and Comparative Examples.

Example 2

The second etching conditions were changed, and the patterning performance was evaluated in the same manner as in Example 1.
Second Etching Conditions
Gas flow rate: $Ar/N_2/CF_4/O_2=500/500/2/25$ ml/min
  (ratio of halogen compound gas: 0.19%)
Bias: RF power: 800 W,
  Antenna bias: 100 W and
  Wafer bias: 600 W
Electrode height: 68 mm
Pressure: 4.0 Pa
Etching time: 17 seconds (etching amount of GREEN film layer of 0.050 μm+overetching rate of 10%)

Example 3

The second etching conditions were changed, and the patterning performance was evaluated in the same manner as in Example 1.
Second Etching Conditions
Gas flow rate: $Ar/N_2/CF_4/O_2=500/500/10/25$ ml/min
  (ratio of halogen compound gas: 0.966%)
Bias: RF power: 800 W,
  Antenna bias: 100 W and
  Wafer bias: 600 W
Electrode height: 68 mm
Pressure: 4.0 Pa
Etching time: 15 seconds (etching amount of GREEN film layer of 0.050 μm+overetching rate of 10%)

Example 4

The second etching conditions were changed, and the patterning performance was evaluated in the same manner as in Example 1.
Second Etching Conditions
Gas flow rate: $Ar/N_2/CF_4/O_2=500/500/5/25$ ml/min
  (ratio of halogen compound gas: 0.48%)
Bias: RF power: 800 W,
  Antenna bias: 100 W and
  Wafer bias: 600 W
Electrode height: 68 mm
Pressure: 8.0 Pa
Etching time: 15 seconds (etching amount of GREEN film layer of 0.050 μm+overetching rate of 10%)

Example 5

The second etching conditions were changed, and the patterning performance was evaluated in the same manner as in Example 1.
Second Etching Conditions
Gas flow rate: $Ar/N_2/CF_4/O_2=500/500/5/25$ mL/min
  (ratio of halogen compound gas: 0.48%)
Bias: RF power: 800 W,
  Antenna bias: 100 W and
  Wafer bias: 600 W
Electrode height: 68 mm
Pressure: 6.0 Pa
Etching time: 15 seconds (etching amount of GREEN film layer of 0.050 μm+overetching rate of 10%)

Example 6

The second etching conditions were changed, and the patterning performance was evaluated in the same manner as in Example 1.
Second Etching Conditions
Gas flow rate: $Ar/N_2/CF_4/O_2=500/500/5/25$ ml/min
  (ratio of halogen compound gas: 0.48%)
Bias: RF power: 800 W,
  Antenna bias: 100 W and
  Wafer bias: 600 W
Electrode height: 68 mm
Pressure: 1.0 Pa
Etching time: 15 seconds (etching amount of GREEN film layer of 0.050 μm+overetching rate of 10%)

Example 7

The second etching conditions were changed, and the patterning performance was evaluated in the same manner as in Example 1.
Second Etching Conditions
Gas flow rate: $Ar/N_2/CF_4/O_2=500/500/5/25$ ml/min
  (ratio of halogen compound gas: 0.48%)
Bias: RF power: 800 W,
  Antenna bias: 100 W and
  Wafer bias: 600 W
Electrode height: 68 mm
Pressure: 0.5 Pa
Etching time: 15 seconds (etching amount of GREEN film layer of 0.050 μm+overetching rate of 10%)

Example 8

The second etching conditions were changed, and the patterning performance was evaluated in the same manner as in Example 1.
Second Etching Conditions
Gas flow rate: $Ar/N_2/C_4F_6/O_2=500/500/5/25$ ml/min
  (ratio of halogen compound gas: 0.48%)
Bias: RF power: 800 W,
  Antenna bias: 100 W and
  Wafer bias: 600 W
Electrode height: 68 mm
Pressure: 4.0 Pa
Etching time: 15 seconds (etching amount of GREEN film layer of 0.050 μm+overetching rate of 10%)

Comparative Example 1

The second etching conditions were changed, and the patterning performance was evaluated in the same manner as in Example 1.
Second Etching Conditions
Gas flow rate: $Ar/N_2/CF_4/O_2=500/500/5/25$ ml/min
  (ratio of halogen compound gas: 0.48%)
Bias: RF power: 800 W,
  Antenna bias: 100 W and
  Wafer bias: 600 W
Electrode height: 68 mm
Pressure: 10.0 Pa
Etching time: 16 seconds (etching amount of GREEN film layer of 0.050 μm+overetching rate of 10%)
After stripping the photoresist, the pattern shape was evaluated. As a result, a checkered pattern (first organic pattern) was formed by the GREEN heat curable composition. The difference in pattern line width change of the colored layer was 0.20 μm or more. The Si substrate damage (shaving amount) of the lower layer was 0.017 μm.

Comparative Example 2

The second etching conditions were changed, and the patterning performance was evaluated in the same manner as in Example 1.
Second Etching Conditions
Gas flow rate: $Ar/N_2/CF_4/O_2=500/500/15/25$ ml/min
  (ratio of halogen compound gas: 1.44%)
Bias: RF power: 800 W,
  Antenna bias: 100 W and
  Wafer bias: 600 W
Electrode height: 68 mm
Pressure: 4.0 Pa
Etching time: 16 seconds (etching amount of GREEN film layer of 0.050 μm+overetching rate of 10%)

Comparative Example 3

The second etching conditions were changed, and the patterning performance was evaluated in the same manner as in Example 1.
Third Etching Conditions
Gas flow rate: $Ar/CF_4/O_2=500/5/25$ ml/min
  (ratio of halogen compound gas: 0.94%)
Bias: RF power: 800 W,
  Antenna bias: 100 W and
  Wafer bias: 600 W
Electrode height: 68 mm
Pressure: 4.0 Pa
Etching time: 18 seconds (etching amount of GREEN film layer of 0.050 μm+overetching rate of 10%)

As shown below, the conditions of each dry etching step and the results of each evaluation are summarized in Table 1.

Further, each evaluation was performed using a scanning electron microscope S4800 (SEM, manufactured by Hitachi High-Technologies Corporation) to observe the cross-section. In Table 1, the evaluation criteria for the lower layer damage caused by etching and the difference in pattern width change are as follows.

Lower layer damage caused by etching:

| | |
|---|---|
| 0.050 μm or more | bad (C) |
| Less than 0.050 μm to 0.030 μm | practically allowable (B) |
| Less than 0.030 μm to 0.010 μm | good (A) |
| Less than 0.010 μm | very good (AA) |

Difference in pattern width change:

| | |
|---|---|
| 0.020 μm or more | bad (C) |
| Less than 0.20 μm to 0.15 μm | practically allowable (B) |
| Less than 0.15 μm to 0.05 μm | good (A) |
| Less than 0.05 μm | very good (AA) |

Further, the lower layer damage and the difference in pattern width change are the average of three points including the center of 8-inch wafer and the upper and lower portion (15 mm far from the edge).

TABLE 1

| | Thickness of organic film layer (μm) | First dry etching step | | | | Second dry etching step | |
|---|---|---|---|---|---|---|---|
| | | Gas species | Flow rate (ml/min) | Pressure | Time | Gas species | Flow rate (ml/min) |
| Example 1 | 0.5 | $Ar/CF_4/O_2$ | 800/200/50 | 2.0 Pa | 60 sec | $Ar/N_2/CF_4/O_2$ | 500/500/5/25 |
| Example 2 | 0.5 | $Ar/CF_4/O_2$ | 800/200/50 | 2.0 Pa | 60 sec | $Ar/N_2/CF_4/O_2$ | 500/500/2/25 |
| Example 3 | 0.5 | $Ar/CF_4/O_2$ | 800/200/50 | 2.0 Pa | 60 sec | $Ar/N_2/CF_4/O_2$ | 500/500/10/25 |
| Example 4 | 0.5 | $Ar/CF_4/O_2$ | 800/200/50 | 2.0 Pa | 60 sec | $Ar/N_2/CF_4/O_2$ | 500/500/5/25 |
| Example 5 | 0.5 | $Ar/CF_4/O_2$ | 800/200/50 | 2.0 Pa | 60 sec | $Ar/N_2/CF_4/O_2$ | 500/500/5/25 |
| Example 6 | 0.5 | $Ar/CF_4/O_2$ | 800/200/50 | 2.0 Pa | 60 sec | $Ar/N_2/CF_4/O_2$ | 500/500/5/25 |
| Example 7 | 0.5 | $Ar/CF_4/O_2$ | 800/200/50 | 2.0 Pa | 60 sec | $Ar/N_2/CF_4/O_2$ | 500/500/5/25 |
| Example 8 | 0.5 | $Ar/CF_4/O_2$ | 800/200/50 | 2.0 Pa | 60 sec | $Ar/N_2/C_4F_6/O_2$ | 500/500/5/25 |
| Comparative example 1 | 0.5 | $Ar/CF_4/O_2$ | 800/200/50 | 2.0 Pa | 60 sec | $Ar/N_2/CF_4/O_2$ | 500/500/5/25 |
| Comparative example 2 | 0.5 | $Ar/CF_4/O_2$ | 800/200/50 | 2.0 Pa | 60 sec | $Ar/N_2/CF_4/O_2$ | 500/500/15/25 |
| Comparative example 3 | 0.5 | $Ar/CF_4/O_2$ | 800/200/50 | 2.0 Pa | 60 sec | $Ar/CF_4/O_2$ | 500/5/25 |

| | Second dry etching step | | | | Difference in pattern width change |
|---|---|---|---|---|---|
| | Ratio of halogen compound and gas | Pressure | Time | Lower layer damage (μm) | Resist to organic film layer after etching |
| Example 1 | 0.48% | 4.0 Pa | 15 sec | 0.01, A | 0.04, AA |
| Example 2 | 0.19% | 4.0 Pa | 17 sec | 0.005, AA | 0.03, AA |

TABLE 1-continued

|  | | | | | |
|---|---|---|---|---|---|
| Example 3 | 0.97% | 4.0 Pa | 15 sec | 0.035, B | 0.07, A |
| Example 4 | 0.48% | 8.0 Pa | 15 sec | 0.011, A | 0.155, B |
| Example 5 | 0.48% | 6.0 Pa | 15 sec | 0.011, A | 0.11, A |
| Example 6 | 0.48% | 1.0 Pa | 15 sec | 0.009, AA | 0.05, A |
| Example 7 | 0.48% | 0.5 Pa | 15 sec | 0.011, A | 0.01, AA |
| Example 8 | 0.48% | 4.0 Pa | 15 sec | 0.017, A | 0.04, AA |
| Comparative example 1 | 0.48% | 10.0 Pa | 16 sec | 0.017, A | 0.205, C |
| Comparative example 2 | 1.44% | 4.0 Pa | 16 sec | 0.065, C | 0.08, B |
| Comparative example 3 | 0.94% | 4.0 Pa | 18 sec | 0.048, B | 0.25, C |

As obviously seen from the results shown in Table 1, it is understood that the difference in pattern width change is high in Comparative Example 1 in which the pressure in the second dry etching step exceeded 8.0 Pa. It is understood that the Si substrate damage of the lower layer is high in Comparative Example 2 in which the flow rate of the halogen compound gas is 1.0% or more of the total gas flow rate in the second dry etching step. It is understood that the difference in pattern width change is high in Comparative Example 3 in which the third gas is not used in the second dry etching step.

Meanwhile, it is understood that the substrate damage and the difference in pattern width change are all low in Examples 1 to 8 in which the gas flow rate ratio to oxygen in the second dry etching step is reduced as compared with the gas flow rate ratio in the first etching step, and the flow rate of the halogen compound gas is less than 1.0% of the total gas flow rate.

[Preparation of Color Filter Array]

Hereinafter, examples of preparing a color filter array will be explained with reference to the present Examples.

After processing of Example 1 as described above, the formation after the second layer was continuously carried out.

(Formation after Second Layer)

On the Si substrate in which the Bayer pattern was formed as described above, the second color filter layer and the third color filter layer were formed by the photolithograpy.

—Preparation of Photosensitive Compositions for Second Layer and Third Layer—

(RED Composition for Second Layer)

Pigment dispersion liquid (manufactured by Toyo Ink Co., Ltd.) 59.9 g

RED pigment (PR 254/PY 139=100/35 (mass ratio))/dispersant/dispersion resin [BYK-2001 manufactured by BYK Chemie/benzyl methacrylate/methacrylic acid copolymer (molar ratio: 70/30, Mw: 30,000)] ratio (mass ratio) of dispersant/dispersion resin=4/21

Solid content: 19.6% by mass, mass of pigments: 12.0% by mass

| | |
|---|---|
| Photosensitive initiator | 0.49 g |
| (IRGACURE OXE 01, manufactured by BASF Corp.) | |
| Monomer 1 | 2.74 g |
| (DPHA, manufactured by Nippon Kayaku Co., Ltd.) | |
| Monomer 2 | 0.68 g |
| (RP1040, manufactured by Nippon Kayaku Co., Ltd.) | |
| Developing resin containing solution | 3.42 g |
| (Cyclomer-P, 50% by mass, manufactured by Daicel Corporation) | |
| Surfactant | 0.18 g |
| (nonionic surfactant, Pionin D-6315, manufactured by Takemoto Oil & Fat Co., Ltd.) | |

-continued

| | |
|---|---|
| Solvent PGMEA/EEP | 12.1 g/16.5 g |

(BLUE composition for third layer)

Pigment dispersion liquid 59.9 g
(manufactured by Sanyo Color Works Ltd.)

BLUE pigment (PB 15:6/PV 23=100/25 (mass ratio))/dispersant/dispersion resin [BYK-2001 manufactured by BYK Chemie/benzyl methacrylate/methacrylic acid copolymer (molar ratio: 70/30, Mw: 30,000)] ratio (mass ratio) of dispersant/dispersion resin=4/21

Solid content: 19.5% by mass, mass of pigments: 14.1% by mass

| | |
|---|---|
| Photosensitive initiator | 1.12 g |
| (IRGACURE OXE 01, manufactured by BASF Corp.) | |
| Monomer 1 | 3.51 g |
| (Aronix M-305, manufactured by Toa Gosei Co., Ltd.) | |
| Monomer 2 | 1.17 g |
| (RP1040, manufactured by Nippon Kayaku Co., Ltd.) | |
| Developing resin containing solution 1 | 1.14 g |
| (Cyclomer-P, 50% by mass, manufactured by Daicel Corporation) | |
| Developing resin containing solution 2 | 6.16 g |
| (methacrylic acid/benzyl methacrylate/hydroxyethyl methacrylate copolymer, 40% by mass, solvent: PGMEA) | |
| Surfactant | 0.19 g |
| (nonionic surfactant, Pionin D-6315, manufactured by Takemoto Oil & Fat Co., Ltd.) | |
| Solvent PGMEA/EEP | 14.29 g/17.0 g |

—Formation of Second Layer (RED Film Layer)—

Figure 5:
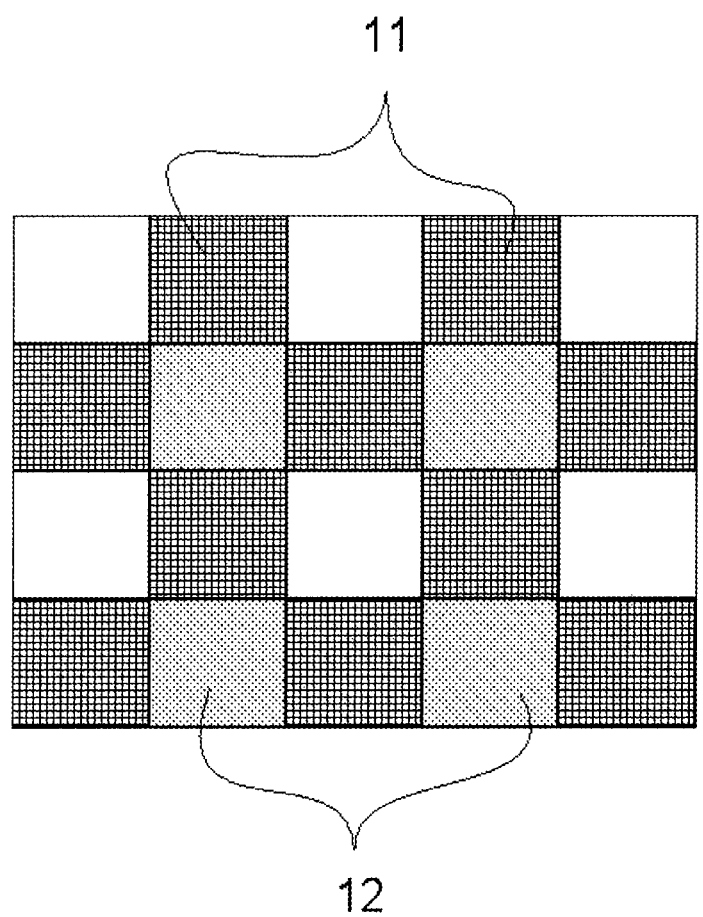
FIG. 5 is a schematic top plan view after formation of GREEN pattern and RED pattern.

As illustrated in FIG. 5, the second colored layer and the RED composition were coated by spin coating on the substrate having a GREEN pattern 11 formed thereon. The film thickness was set to 0.6 μm after pre-baking as a film thickness in the region where a RED pattern 12 was formed, on the Si substrate having the GREEN pattern thereon. The detailed manufacturing conditions are described below.

—Formation of RED Film Layer—

Coating, development and post-baking apparatus: Clean Track ACT 8 (manufactured by Tokyo Electron Limited)

Exposure apparatus: FPA3000i5+ (manufactured by Canon Inc.)

Film thickness: 0.6 μm (after pre-baking)

Exposure: 300 mJ, pattern size 1.0 μm

Development: CD-2060 (manufactured by FUJIFILM Electronic Materials Co., Ltd.), puddle for 60 seconds Development: Rinse with pure water for 30 seconds and spin dry at 20 sec/1000 rpm Post-baking: 220° C.×5 minutes When observed after patterning, the RED pattern 12 of 1.0 μm was formed in the region where the RED pattern 12 was to be formed, and no stripping was observed. Further, the film thickness was 0.5 μm, which is the same as that of the GREEN pattern 11.

—Formation of Third Layer (BLUE Film Layer)—

Figure 6:
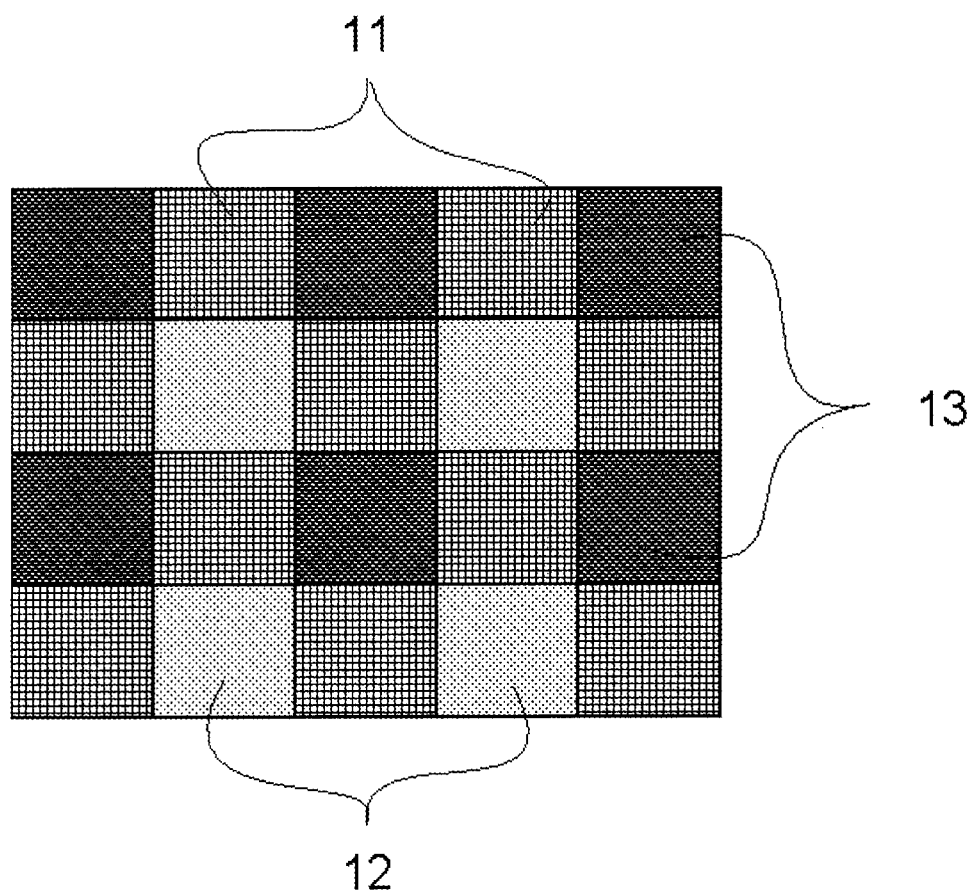
FIG. 6 is a schematic top plan view illustrating Bayer arrangement after formation of GREEN pattern, RED pattern and BLUE pattern.

As illustrated in FIG. 6, the third colored layer and the BLUE composition were coated by spin coating on the substrate having the GREEN pattern 11 formed thereon. The film thickness was set to 0.6 μm after pre-baking as a film thickness in the region where a BLUE pattern 13 was formed, on the Si substrate having the BLUE pattern thereon. The detailed manufacturing conditions are described below.

—Formation of BLUE Film Layer—

Coating, development and post-baking apparatus: Clean Track ACT 8 (manufactured by Tokyo Electron Limited)
Exposure apparatus: FPA3000i5+ (manufactured by Canon Inc.)
Film thickness: 0.6 μm (after pre-baking)
Exposure: 450 mJ, pattern size 1.0 μm
Development: CD-2060 (manufactured by FUJIFILM Electronic Materials Co., Ltd.), puddle for 60 seconds
Development: Rinse with pure water for 30 seconds and spin dry at 20 sec/1000 rpm
Post-baking: 220° C.×5 minutes When observed after patterning, the BLUE pattern 13 of 1.0 μm was formed in the region where the BLUE pattern 13 was to be formed, and no stripping was observed. Further, the film thickness was 0.5 μm, which is the same as that of the GREEN pattern 11.

The exemplary embodiment of the present invention is not limited to the color filter array having the BAYER arrangement of RGB three colors, but may also be applied to a color filter with four or more colors, such as RGB+new GREEN.

Further, the dry etching conditions in the present invention is not limited to the processing range of the first color filter, but may also be applied to a etching processing in the case of forming a third colored pattern, for example, as described in Japanese Patent Application Laid-Open No. 2009-31723.

The method for manufacturing a color filter for solid-state imaging devices of the present invention and the color filter obtainable thereby may be applied to a liquid crystal display device and a solid-state imaging device, and is particularly appropriate for a CCD or a CMOS with a high resolution over one million pixels. The color filter obtainable by the method for manufacturing a color filter of the present invention may be used as a color filter disposed between a light-receiving unit of each pixel composing CMOS and a microlens for concentrating light.

Further, the Examples were described in detail with respect to the color filter array with the Bayer arrangement of GREEN×2, RED×1 and BLUE×1, but are not limited thereto. The Examples are applicable to a four-color filter of CYAN, MAGENTA, YELLOW and GREEN, and a color filter with a new arrangement using transparent pixels or semipermeable pixels, and may obtain the effects of the present invention equally.

INDUSTRIAL APPLICABILITY

According to the method for manufacturing a color filter of the exemplary embodiment of the present invention, substrate damage (shaving) can be suppressed while suppressing sidewall deposits in a broad range of pressure parameters, and thus, difference between pattern width of a photoresist mask and pattern width of an organic film layer after dry etching (difference in pattern width change) can be reduced.

The color filter of the present invention can be obtained by the above-mentioned method. Therefore, the pattern dimension accuracy of pixels is high and the substrate damage is low.

This application is based on a Japanese patent application filed on Sep. 29, 2011 (Japanese Patent Application No. 2011-215626), and the contents thereof are incorporated herein by reference.

The invention claimed is:

1. A pattern forming method, comprising:
   forming an organic film layer on a substrate;
   forming a patterned photoresist mask on the organic film layer; and
   performing a dry etching process to form a pattern on the organic layer,
   wherein the dry etching process includes:
   (1) a first dry etching using a first mixed gas containing oxygen and a halogen compound gas to partially remove the organic film layer so that the surface of the substrate is not exposed, and to form a removed portion in the organic film layer according to a shape of the patterned photoresist mask; and
   (2) after the first dry etching step, a second dry etching using a second mixed gas containing: oxygen; a halogen compound gas of which gas flow rate ratio to oxygen is lower as compared with the gas flow rate ratio of the halogen compound in the first dry etching step; and at least one type of a third gas selected from the group consisting of $H_2$, $N_2$, $CH_4$ and CO, at a pressure of 8.0 Pa or less, so that the substrate under the organic film layer is exposed, and
   the flow rate of the halogen compound gas in the second dry etching is less than 1.0% of a total gas flow rate of the second mixed gas.

2. The method of claim 1,
   wherein the flow rate of the halogen gas compound in the second dry etching is 0.15% or more of the total gas flow rate of the second mixed gas.

3. The method of claim 1,
   wherein the second dry etching is performed at a pressure of 0.8 Pa to 8.0 Pa.

4. The method of claim 1, further comprising overetching after the second etching step.

5. The method of claim 1,
   wherein a difference between a pattern width of the photoresist mask and a pattern width of the organic film layer after the first and second dry etching is less than 0.2 μm.

6. The method of claim 1,
   wherein the surface of the substrate is dry etched in a depth of 0.05 μm or less in the thickness direction of the substrate.

7. The method of claim 1, further comprising stripping a remaining photoresist mask by dissolution.

8. A method for manufacturing a color filter, comprising:
   forming a first colored pattern using the method according to claim 1;
   (i) forming an nth colored layer, wherein n is an integer of 2 or more, by filling a first recess of a surface side of the substrate where the first colored pattern is formed to form an nth colored pattern;
   (ii) dry etching the nth colored layer formed and the first colored pattern to form an unevenness pattern;
   (iii) forming an (n+1)th colored layer by filling a second recess of a surface side of the substrate where the unevenness pattern is formed to form the (n+1)th colored pattern;

(iv) repeating the (i), (ii) and (iii) at least once; and
(v) removing an area not contributing to colored pattern formation of the nth colored layer by a photolithography treatment or a planarization treatment,
wherein the first recess is formed when forming the first colored pattern and the second recess is formed when (ii) dry etching the nth colored layer formed and the first colored pattern.

9. A method for manufacturing a color filter, comprising:
forming an organic film layer on a substrate;
forming a patterned photoresist mask on the organic film layer; and
performing a dry etching process to form a pattern on the organic layer,
wherein the dry etching process includes:
 (1) a first dry etching using a first mixed gas containing oxygen and a halogen compound gas to partially remove the organic film layer so that the surface of the substrate is not exposed, and to form a removed portion in the organic film layer according to a shape of the patterned photoresist mask; and
 (2) after the first dry etching step, a second dry etching using a second mixed gas containing: oxygen; a halogen compound gas of which gas flow rate ratio to oxygen is lower as compared with the gas flow rate ratio of the halogen compound in the first dry etching step; and at least one type of a third gas selected from the group consisting of $H_2$, $N_2$, $CH_4$ and CO, at a pressure of 8.0 Pa or less, so that the substrate under the organic film layer is exposed, and
the flow rate of the halogen compound gas in the second dry etching is less than 1.0% of a total gas flow rate of the second mixed gas.

* * * * *